(12) United States Patent
Lee et al.

(10) Patent No.: US 10,896,966 B2
(45) Date of Patent: Jan. 19, 2021

(54) SEMICONDUCTOR DEVICE

(71) Applicant: Samsung Electronics Co., Ltd., Suwon-si (KR)

(72) Inventors: Dong-jin Lee, Seoul (KR); Bong-soo Kim, Yongin-si (KR); Ji-young Kim, Yongin-si (KR); Ho-rim Yoo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/385,245

(22) Filed: Apr. 16, 2019

(65) Prior Publication Data
US 2020/0127106 A1 Apr. 23, 2020

(30) Foreign Application Priority Data
Oct. 17, 2018 (KR) .......................... 10-2018-0123920

(51) Int. Cl.
*H01L 29/423* (2006.01)
*H01L 29/49* (2006.01)
*H01L 21/28* (2006.01)
*H01L 21/8238* (2006.01)
*H01L 27/092* (2006.01)

(52) U.S. Cl.
CPC .... *H01L 29/4236* (2013.01); *H01L 21/28088* (2013.01); *H01L 21/823828* (2013.01); *H01L 27/092* (2013.01); *H01L 29/4966* (2013.01)

(58) Field of Classification Search
CPC ............ H01L 29/4236; H01L 29/7827; H01L 29/66621; H01L 29/66348; H01L 29/7395; H01L 29/7397; H01L 27/10876; H01L 27/10823; H01L 27/0886; H01L 21/76877; H01L 21/76879; H01L 21/823431
See application file for complete search history.

(56) References Cited

U.S. PATENT DOCUMENTS

| | | | |
|---|---|---|---|
| 8,053,831 B2 | 11/2011 | Yu | |
| 8,993,391 B2 | 3/2015 | Sung | |
| 9,082,647 B2 | 7/2015 | Jang et al. | |
| 9,368,586 B2 | 6/2016 | Rouh et al. | |
| 9,634,011 B2 | 4/2017 | Kang et al. | |
| 9,748,234 B2 * | 8/2017 | Kwon | H01L 21/82345 |
| 9,966,376 B2 | 5/2018 | Kim et al. | |
| 10,043,811 B1 * | 8/2018 | Tsai | H01L 27/10891 |
| 2016/0284699 A1 * | 9/2016 | Jeong | H01L 29/6656 |
| 2017/0125422 A1 * | 5/2017 | Kang | H01L 29/7813 |
| 2018/0130806 A1 * | 5/2018 | Nam | H01L 27/10826 |
| 2018/0158871 A1 | 6/2018 | Lee et al. | |
| 2018/0166450 A1 | 6/2018 | Kim et al. | |

\* cited by examiner

*Primary Examiner* — Hsien Ming Lee
(74) *Attorney, Agent, or Firm* — Muir Patent Law, PLLC

(57) ABSTRACT

A semiconductor device includes a substrate including a first region and a second region, a buried gate structure located on a first recess in the first region of the substrate, and a recess gate structure located on a second recess in the second region of the substrate, wherein the buried gate structure is buried in the substrate, an upper portion of the recess gate structure is not buried in the substrate, and a first work function adjustment layer in the buried gate structure may include a material identical to a material included in a second work function layer of the recess gate structure.

16 Claims, 19 Drawing Sheets

SEMICONDUCTOR DEVICE

CROSS-REFERENCE TO RELATED APPLICATION

This application claims the benefit of priority under 35 U.S.C. § 119 to Korean Patent Application No. 10-2018-0123920, filed on Oct. 17, 2018, in the Korean Intellectual Property Office, the disclosure of which is incorporated herein in its entirety by reference.

BACKGROUND

The inventive concept relates to a semiconductor device, and more particularly, to a semiconductor device including a recess channel transistor.

As the integrity of a semiconductor device has increased, an area occupied by each of the transistors included in the semiconductor device has gradually decreased, and a channel length of a transistor has also decreased. However, as the channel length decreases, a standard deviation of threshold voltages increases. To address the above-mentioned matter, a recess channel transistor may be used. A recess gate of a recess channel transistor is formed on a recess of a substrate and thus, a greater channel length may be obtained in a same area, and accordingly, a standard deviation of a threshold voltage may be reduced.

SUMMARY

The inventive concept provides a semiconductor device which includes a recess channel transistor, has a reduced standard deviation of threshold voltages, and is easily manufactured.

According to some embodiments, the disclosure is directed to a semiconductor device comprising: a substrate comprising a first region and a second region; a buried gate structure located on a first recess in the first region of the substrate and comprising a first work function adjustment layer; and a recess gate structure located on a second recess in the second region of the substrate and comprising a second work function adjustment layer, wherein the buried gate structure is buried in the substrate, wherein an upper portion of the recess gate structure is not buried in the substrate, and wherein the first work function adjustment layer in the buried gate structure and the second work function adjustment layer in the recess gate structure comprise the same material.

According to some embodiments, the disclosure is directed to a semiconductor device comprising: a substrate comprising a first region and a second region; a buried gate structure on a first recess in the first region of the substrate; and a recess gate structure on a second recess in the second region of the substrate, wherein the buried gate structure comprises a first gate insulating layer on the first recess, a lower filling layer at a lower portion of the buried gate structure, an upper filling layer at an upper portion of the buried gate structure, and a first work function adjustment layer between the upper filling layer and the first gate insulating layer, wherein the recess gate structure comprises a second gate insulating layer on the second recess, a second work function adjustment layer on the second gate insulating layer, and a filling layer on the second work function adjustment layer, and wherein the first work function adjustment layer comprises a material the same as a material included in the second work function adjustment layer.

According to some embodiments, the disclosure is directed to a semiconductor device comprising: a substrate comprising a first region, a second region, and a third region; a buried gate structure comprising a first gate insulating layer on a first recess in the first region of the substrate and a first work function adjustment layer on the first gate insulating layer; a first recess gate structure comprising a second gate insulating layer on a second recess in the second region of the substrate and a second work function adjustment layer on the second gate insulating layer; and a second recess gate structure comprising a third gate insulating layer on a third recess in the third region of the substrate and a third work function adjustment layer on the third gate insulating layer, wherein the first work function adjustment layer and the second work function adjustment layer comprise a same material, and wherein the first work function adjustment layer and the third work function adjustment layer comprise different materials.

BRIEF DESCRIPTION OF THE DRAWINGS

FIG. 2 shows cross-sectional views of a semiconductor device according to an example embodiment, the cross-sectional views being taken along lines AN, BB', and CC' shown in FIG. 1.

DETAILED DESCRIPTION

Figure 1:
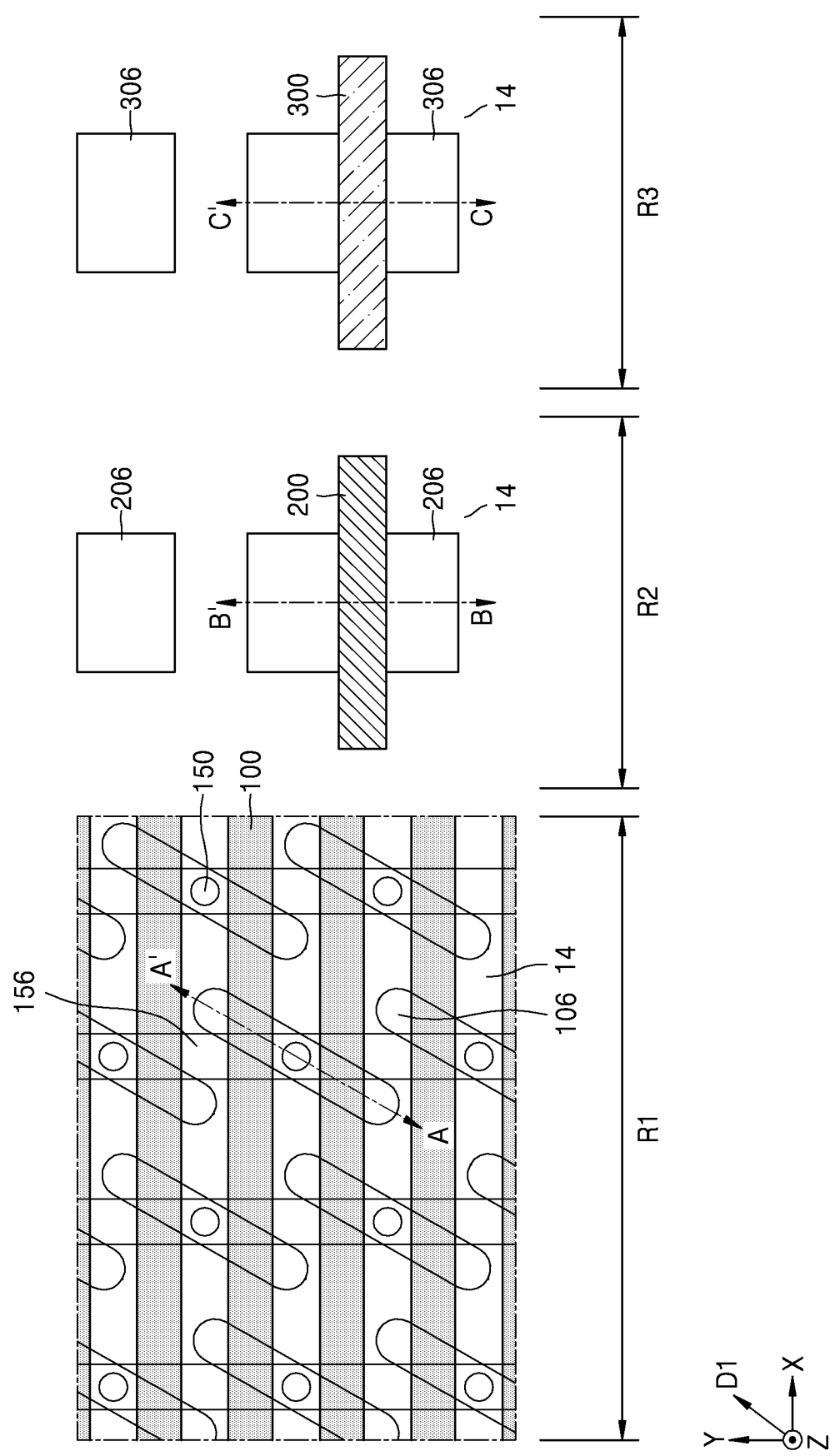
FIGS. 1 and 2 are a top-plan view and a cross-sectional view, respectively, of a semiconductor device according to an example embodiment of the inventive concept.
Figure 2:
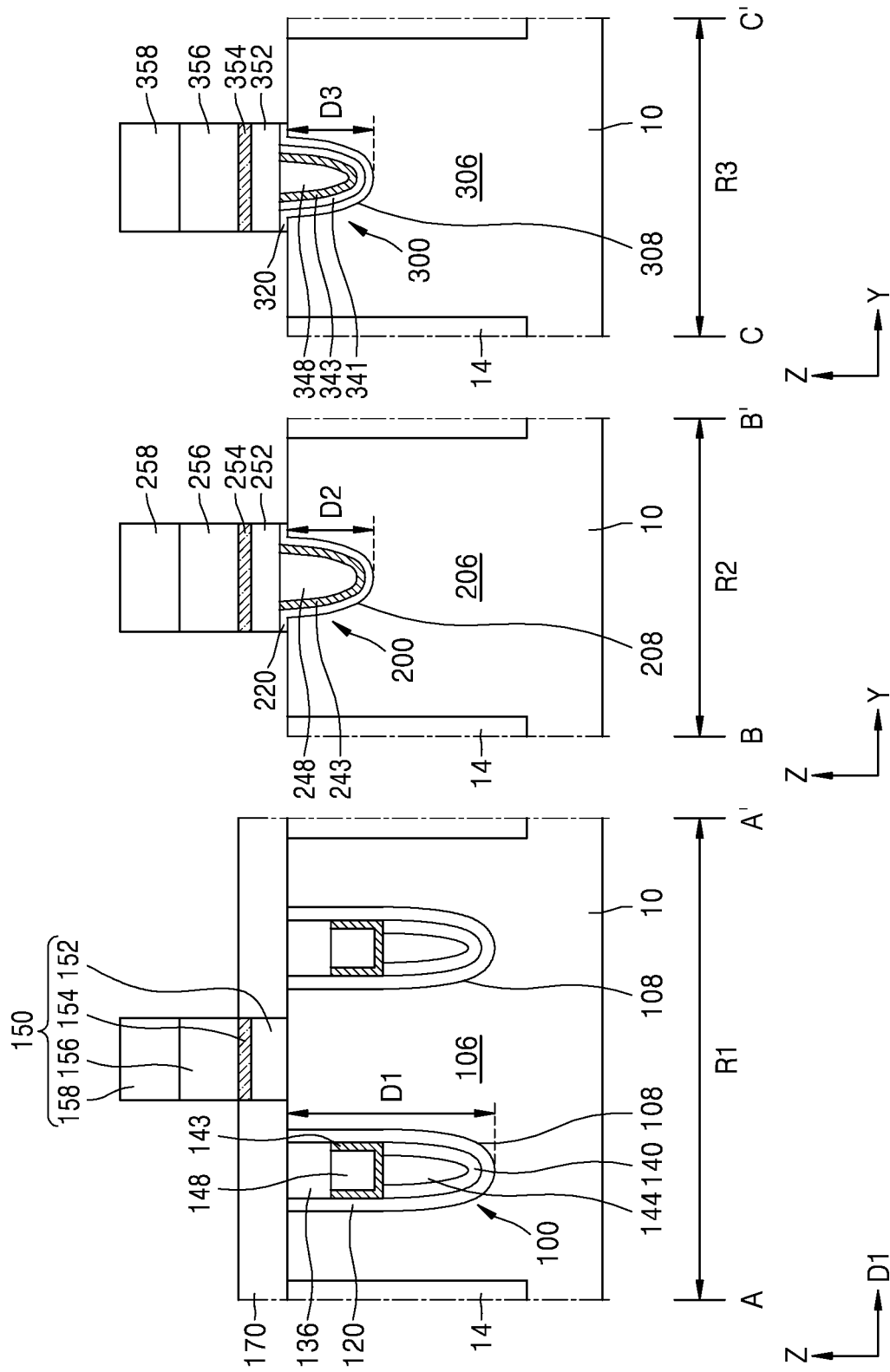

FIGS. 1 and 2 are a top-plan view and a cross-sectional view, respectively, of a semiconductor device according to an example embodiment of the inventive concept, respectively. FIG. 2 shows cross-sectional views of a semiconductor device according to an example embodiment, the cross-sectional views being taken along lines AA', BB', and CC' shown in FIG. 1.

Referring to FIGS. 1 and 2, a substrate 10 may include a first region R1, a second region R2, and a third region R3. In the specification, alternatively, the first region R1 may also be referred to as a cell region, and the second region R2 and the third region R3 may also be referred to as core regions. In some embodiments, the substrate 10 may include a semiconductor material such as a Group IV semiconductor material, a Group III-V semiconductor material, or a Group II-VI semiconductor material. The Group IV semiconductor material may, for example, include silicon (Si), germanium (Ge), or Si—Ge. The Group III-V semiconductor material may, for example, include gallium arsenide (GaAs), indium phosphide (InP), gallium phosphide (GaP), indium arsenide (InAs), indium stibium (InSb), or indium gallium arsenide (InGaAs). The Group II-VI semiconductor material may, for example, include zinc telluride (ZnTe) or cadmium sulfide (CdS). The substrate 10 may include a bulk wafer or an epitaxial layer.

The first region R1 of the substrate 10 may have a plurality of first active regions 106, the second region R2 of the substrate 10 may have a plurality of second active regions 206, and the third region R3 of the substrate 10 may have a plurality of third active regions 306. Each of the plurality of first active regions 106 may have a relatively long island shape including a minor axis and a major axis.

For example, each of the plurality of first active regions 106 may have a rectangular shape with rounded corners that is elongated along the major axis. As shown in FIG. 1, the major axes of the first active regions 106 may be aligned in direction D1. Shapes and arrangements of the plurality of second active regions 206 and the plurality of third active regions 306 are not limited to those shown in FIG. 1. For example, the plurality of second active regions 206 and the plurality of third active regions 306 are each illustrated as having a rectangular planar shape, but the plurality of second active regions 206 and the plurality of third active regions 306 may each have a more complex shape (e.g., polygonal, circular, etc.). The plurality of first active regions 106 and the plurality of second active regions 206 may be of the same conductivity type, and the plurality of first active regions 106 and the plurality of third active regions 306 may be of different conductive types.

The plurality of first active regions 106, the plurality of second active regions 206, and the plurality of third active regions 306 may be defined by a device isolation layer 14. The device isolation layer 14 may include, but is not limited to, an insulating material such as fluoride silicate glass (FSG), undoped silicate glass (USG), boro-phospho-silicate glass (BPSG), phosphor-silicate glass (PSG), flowable oxide (FOX), plasma enhanced tetra-ethyl-ortho-silicate (PE-TEOS), or tonen silazane (TOSZ). In some embodiments, the device isolation layer 14 may include a multi-layer.

The first region R1 of the substrate 10 may have a first recess 108, the second region R2 of the substrate 10 may have a second recess 208, and the third region R3 of the substrate may have a third recess 308. A depth D1 of the first recess 108 may be greater than each of a depth D2 of the second recess 208 and a depth D3 of the third recess 308. The depth D2 of the second recess 208 and the depth D3 of the third recess 308 may be substantially the same. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A buried gate structure 100 may be located in the first recess 108, a first recess gate structure 200 may be located in the second recess 208, and a second recess gate structure 300 may be located in the third recess 308. The buried gate structure 100 may be a portion of an N-type transistor, the first recess gate structure 200 may be a portion of another N-type transistor, and the second recess gate structure 300 may be a portion of a P-type transistor.

Each of the buried gate structure 100, the first recess gate structure 200, and the second recess gate structure 300 may include a metal gate. For example, each of the buried gate structure 100, the first recess gate structure 200, and the second recess gate structure 300 may not include a polysilicon gate. When a polysilicon gate is used, a polysilicon depletion phenomenon occurs. The polysilicon depletion effect causes an increase in a thickness of an effective gate insulating layer, thereby increasing a standard deviation of threshold voltages More particularly, as the first recess gate structure 200 and the second recess gate structure 300 include metal gates, the polysilicon depletion phenomenon may be prevented and thus, a standard deviation of the threshold voltages may be reduced.

The buried gate structure 100 may, for example, extend lengthwise in the X direction. An item, layer, or portion of an item or layer described as extending "lengthwise" in a particular direction has a length in the particular direction and a width perpendicular to that direction, where the length is greater than the width. The first recess gate structure 200 and the second recess gate structure 300 are illustrated as extending lengthwise in the X direction, but the embodiment is not limited thereto. The buried gate structure 100 may be buried in the substrate 10, and a lower portion of the first recess gate structure 200 and a lower portion of the second recess gate structure 300 may also be buried in the substrate 10. An upper portion of the first recess gate structure 200 and an upper portion of the second recess gate structure 300 may not be buried in the substrate 10. Throughout the specification, when an object is buried in a substrate 10, the top of the object is at a level that is lower than or identical to the top of the substrate 10, wherein the level indicates a distance between the bottom of the substrate 10 and the top of the substrate 10. For example, when the object is buried in the substrate 10, a distance between the bottom of the substrate 10 and the top of the object is less than or equal to the distance between the bottom of the substrate 10 and the top of the substrate 10. In some embodiments, when the object is buried in the substrate 10, the object is formed at least partially below a top surface of the substrate 10, and the substrate 10 surrounds at least a portion of the object. For example, the object may be considered to be buried when it is at least partially embedded in the substrate 10.

The buried gate structure 100 may include a first gate insulating layer 120, a lower filling layer 144, an upper filling layer 148, a barrier layer 140, a first work function adjustment layer 143, and a first gate capping layer 136. A lower portion of the buried gate structure 100 may include a lower portion of the first gate insulating layer 120, the barrier layer 140, and the lower filling layer 144, and an upper portion of the buried gate structure 100 may include an upper portion of the first gate insulating layer 120, the first work function adjustment layer 143, the upper filling layer 148, and the first gate capping layer 136. Throughout the specification, a lower portion denotes a portion that is relatively closer to the bottom of the substrate 10 than an upper portion, and the upper portion denotes a portion that is relatively farther away from the bottom of the substrate 10 than the lower portion.

The first gate insulating layer 120 may be on an inner wall of the first recess 108. The first gate insulating layer 120 may cover the first recess 108. The first gate insulating layer 120 may extend over the lower portion and the upper portion of the buried gate structure 100. The first gate insulating layer 120 may include, but is not limited to, silicon oxide.

The lower filling layer 144 may be at the lower portion of the buried gate structure 100 and the upper filling layer 148 may be at the upper portion of the buried gate structure 100. For example, the upper filling layer 148 may be located above the lower filling layer 144. Each of the lower filling layer 144 and the upper filling layer 148 may include, but are not limited to, a metal such as, for example, tungsten.

The barrier layer 140 may be located at the lower portion of the buried gate structure 100. The barrier layer 140 may be located between the first gate insulating layer 120 and the lower filling layer 144. The barrier layer 140 may cover the lower filling layer 144. The barrier layer 140 may include, but is not limited to, a metal nitride such as titanium nitride.

The first work function adjustment layer 143 may be located at the upper portion of the buried gate structure 100. The first work function adjustment layer 143 may be located between the first gate insulating layer 120 and the upper filling layer 148. In some embodiments, the first work function adjustment layer 143 may further include a portion between the upper filling layer 148 and the lower filling layer 144, in addition to a portion between the upper filling layer 148 and the first gate insulating layer 120. The first work function adjustment layer 143 may cover bottom and sides of the upper filling layer 148. The first work function adjustment layer 143 may include an alloy of a metal-metal nitride. For example, the first work function adjustment layer 143 may include, but is not limited to, lanthanum (La)-titanium nitride (TiN) alloy.

The first gate capping layer 136 may be located at the upper portion of the buried gate structure 100. The first gate capping layer 136 may be located on the upper filling layer 148 and the first work function adjustment layer 143. For example, the first gate capping layer 136 may contact top surfaces of the upper filling layer 148 and the first work function adjustment layer 143. The first gate capping layer 136 may fill a remaining portion of the first recess 108 except a portion filled by the first gate insulating layer 120, the barrier layer 140, the lower filling layer 144, the upper filling layer 148, and the first work function adjustment layer 143. The first gate capping layer 136 may include, but is not limited to, silicon nitride.

The first recess gate structure 200 may include a second gate insulating layer 220, a second work function adjustment layer 243, a first filling layer 248, a first gate layer 252, a second gate layer 254, a third gate layer 256, and a second gate capping layer 258. A lower portion of the first recess gate structure 200 may include the second gate insulating layer 220, the second work function adjustment layer 243, and the first filling layer 248. An upper portion of the first recess gate structure 200 may include the first gate layer 252, the second gate layer 254, the third gate layer 256, and the second gate capping layer 258.

The second gate insulating layer 220 may be located on the second recess 208. The second gate insulating layer 220 may cover the second recess 208. A portion of the second gate insulating layer 220 may extend vertically on a top surface of the substrate 10. The second gate insulating layer 220 may include, but is not limited to, silicon oxide.

The second work function adjustment layer 243 may be located on the second gate insulating layer 220. For example, the second work function adjustment layer 243 may be located on an inside surface of the second gate insulating layer 220. The second work function adjustment layer 243 may cover the first filling layer 248. The second work function adjustment layer 243 may include a material identical to a material included in the first work function adjustment layer 143 of the buried gate structure 100. For example, the second work function adjustment layer 243 may include an alloy of a metal-metal nitride. For example, the second work function adjustment layer 243 may include La—TiN alloy.

The first filling layer 248 may be on the second work function adjustment layer 243. The first filling layer 248 may fill a remaining portion of the second recess 208 except a portion filled with the second gate insulating layer 220 and the second work function adjustment layer 243. The first filling layer 248 may include a material identical to a material included in the upper filling layer 148 of the buried gate structure 100. For example, the first filling layer 248 may include, but is not limited to, a metal such as, for example, tungsten.

The first gate layer 252, the second gate layer 254, the third gate layer 256, and the second gate capping layer 258 may be sequentially stacked on the first filling layer 248. The first gate layer 252, the second gate layer 254, the third gate layer 256, and the second gate capping layer 258 may not be buried in the substrate 10. For example, the first gate layer 252, the second gate layer 254, the third gate layer 256, and the second gate capping layer 258 may be located at vertical levels (in the Z direction) higher than a top surface of the substrate 10. The first gate layer 252 may be located on a top surface of the portion of the second gate insulating layer 220 that extends vertically on the top surface of the substrate 10. The first gate layer 252 may include, but is not limited to, polysilicon. The second gate layer 254 may include, but is not limited to, titanium-silicon-nitride (TSN) or a metal nitride. The third gate layer 256 may include, but is not limited to, a metal such as, for example, tungsten. The second gate capping layer 258 may include, but is not limited to, silicon nitride.

The second recess gate structure 300 may include a third gate insulating layer 320, a third work function adjustment layer 341, a fourth work function adjustment layer 343, a second filling layer 348, a fourth gate layer 352, a fifth gate layer 354, a sixth gate layer 356, and a third gate capping layer 358. A lower portion of the second recess gate structure 300 may include the third gate insulating layer 320, the third work function adjustment layer 341, the fourth work function adjustment layer 343, and the second filling layer 348. An upper portion of the second recess gate structure 300 may include the fourth gate layer 352, the fifth gate layer 354, the sixth gate layer 356, and the third gate capping layer 358.

The third gate insulating layer 320 may be on the third recess 308. The third gate insulating layer 320 may cover the third recess 308. A portion of the third gate insulating layer 320 may extend vertically on a top surface of the substrate 10. The third gate insulating layer 320 may include a material identical to a material included in the second gate insulating layer 220. For example, the third gate insulating layer 320 may include silicon oxide.

The third work function adjustment layer 341 may be located on the third gate insulating layer 320. The third work function adjustment layer 341 may include a material different from that of the first work function adjustment layer 143 of the buried gate structure 100. The third work function adjustment layer 341 may include an alloy of metal-metal nitride. For example, the third work function adjustment layer 341 may include, but is not limited to, aluminum (Al)—TiN alloy.

The fourth work function adjustment layer 343 may be located on the third work function adjustment layer 341. The fourth work function adjustment layer 343 may cover the second filling layer 348. The fourth work function adjustment layer 343 may be located apart from the third gate insulating layer 320. For example, the third work function adjustment layer 341 may be formed between the fourth work function adjustment layer 343 and the third gate insulating layer 320. The fourth work function adjustment layer 343 may include a material identical to a material included in the first work function adjustment layer 143 of the buried gate structure 100. For example, the fourth work function adjustment layer 343 may include, but is not limited to, La—TiN alloy. In some embodiments, the second recess gate structure 300 may not include the fourth work function adjustment layer 343.

The second filling layer 348 may be on the fourth work function adjustment layer 343. The second filling layer 348 may fill a remaining portion of the third recess 308 except a portion filled with the third gate insulating layer 320, the third work function adjustment layer 341, and the fourth work function adjustment layer 343. The second filling layer 348 may include a material identical to a material included in the upper filling layer 148 of the buried gate structure 100. For example, the second filling layer 348 may include, but is not limited to, a metal such as, for example, tungsten.

The fourth gate layer 352, the fifth gate layer 354, the sixth gate layer 356, and the third gate capping layer 358 may be sequentially stacked on the second filling layer 348. The fourth gate layer 352, the fifth gate layer 354, the sixth gate layer 356, and the third gate capping layer 358 may not be buried in the substrate 10. For example, the fourth gate layer 352, the fifth gate layer 354, the sixth gate layer 356, and the third gate capping layer 358 may be located at vertical levels (in the Z direction) higher than a top surface of the substrate 10. The fourth gate layer 352 may be located on a top surface of the portion of the third gate insulating layer 320 that extends vertically on the top surface of the substrate 10. Each of the fourth gate layer 352, the fifth gate layer 354, the sixth gate layer 356, and the third gate capping layer 358 may include a material included in each of the first gate layer 252, the second gate layer 254, the third gate layer 256, and the second gate capping layer 258 of the first recess gate structure 200, respectively. For example, the fourth gate layer 352 may include, but is not limited to, polysilicon. The fifth gate layer 354 may include, but is not limited to, TSN or a metal nitride. The sixth gate layer 356 may include, but is not limited to, a metal such as, for example, tungsten. The third gate capping layer 358 may include, but is not limited to, silicon nitride.

A bit line structure 150 may be on the first region R1 of the substrate 10. The bit line structure 150 may include a bit line contact 152, an interface layer 154, a bit line 156, and a bit line capping layer 158 which are sequentially stacked on the substrate 10. The bit line 156 and the bit line capping layer 158 may extend lengthwise in the Y direction. In some embodiments, a direction in which the bit line 156 and the bit line capping layer 158 extend may be perpendicular to a direction in which the buried gate structure 100 extends, but the embodiments are not limited thereto. Each of the bit line contact 152, the interface layer 154, the bit line 156, and the bit line capping layer 158 may include a material identical to a material included in each of the first gate layer 252, the second gate layer 254, the third gate layer 256, and the second gate capping layer 258 in the first recess gate structure 200, respectively. For example, the bit line contact 152 may include, but is not limited to, polysilicon. The interface layer 154 may include, but is not limited to, TSN or a metal nitride. The bit line 156 may include, but is not limited to, a metal such as, for example, tungsten. The bit line capping layer 158 may include, but is not limited to, silicon nitride.

An interlayer insulating layer 170 may be on the first region R1 of the substrate 10. The interlayer insulating layer 170 may cover side walls of the bit line contact 152 and the interface layer 154. In some embodiments, a top surface of the interlayer insulating layer 170 may be coplanar with a top surface of the interface layer 154. The interlayer insulating layer 170 may include, but is not limited to, silicon oxide.

According to an example embodiment of the inventive concept, as the first recess gate structure 200 and the second recess gate structure 300 are metal gates, the polysilicon depletion phenomenon may be prevented and thus, the standard deviation of the threshold voltages may be reduced. In addition, as it will be described later, the first recess gate structure 200 and the second recess gate structure 300, which may be simultaneously formed with the buried gate structure 100, do not require additional operations and may be easily manufactured.

FIGS. 3 through 19 are cross-sectional views illustrating a method of manufacturing a semiconductor device, according to example embodiments of the inventive concept.

Figure 3:
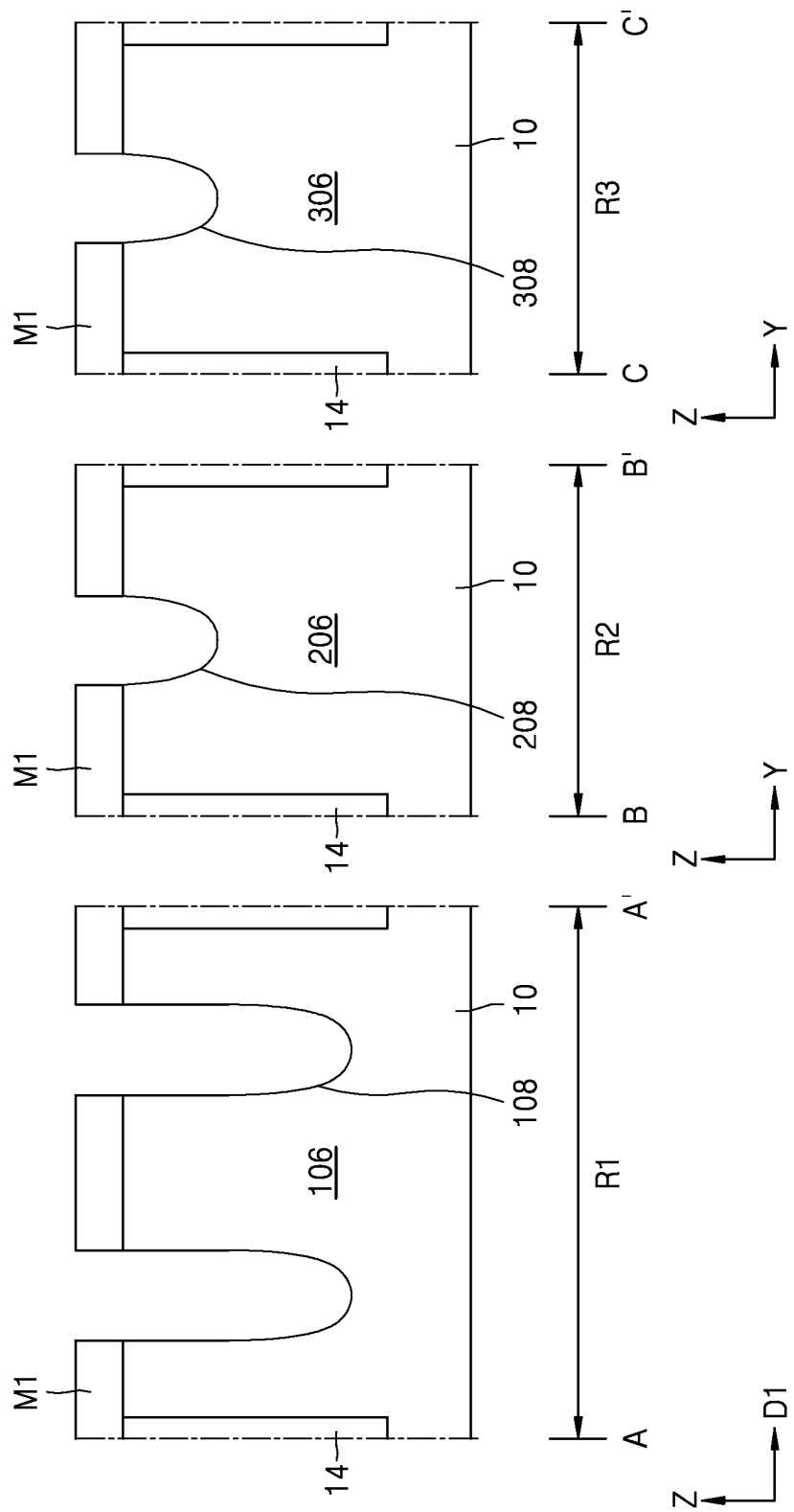
FIGS. 3 through 19 are cross-sectional views for describing a method of manufacturing a semiconductor device, according to example embodiments of the inventive concept.

Referring to FIG. 3, by forming the device isolation layer 14 in the substrate 10, the first active region 106, the second active region 206, and the third active region 306, which are defined by the device isolation layer 14, are formed. Next, the first recesses 108 that intersect with the first active region 106 are formed in the first region R1 of the substrate 10, the second recesses 208 that intersect with the second active region 206 are formed in the second region R2 of the substrate 10, and the third recesses 308 that intersect with the third active region 306 are formed in the third region R3 of the substrate 10. A first mask M1 may be used for etching the first recesses 108, the second recesses 208, and the third recesses 308. In some example embodiments, an etching process may include two etching operations. For example, after an operation of etching the first recess 108 is performed, an operation of etching the second recess 208 and the third recess 308 may be performed. Conversely, after the operation of etching the second recess 208 and the third recess 308 is performed, the operation of etching the first recess 108 may be performed. In another example embodiment, after an operation of etching an upper portion of the first recess 108, the second recess 208, and the third recess 308 are performed, an operation of etching a lower portion of the first recess 108 may be performed.

Figure 4:
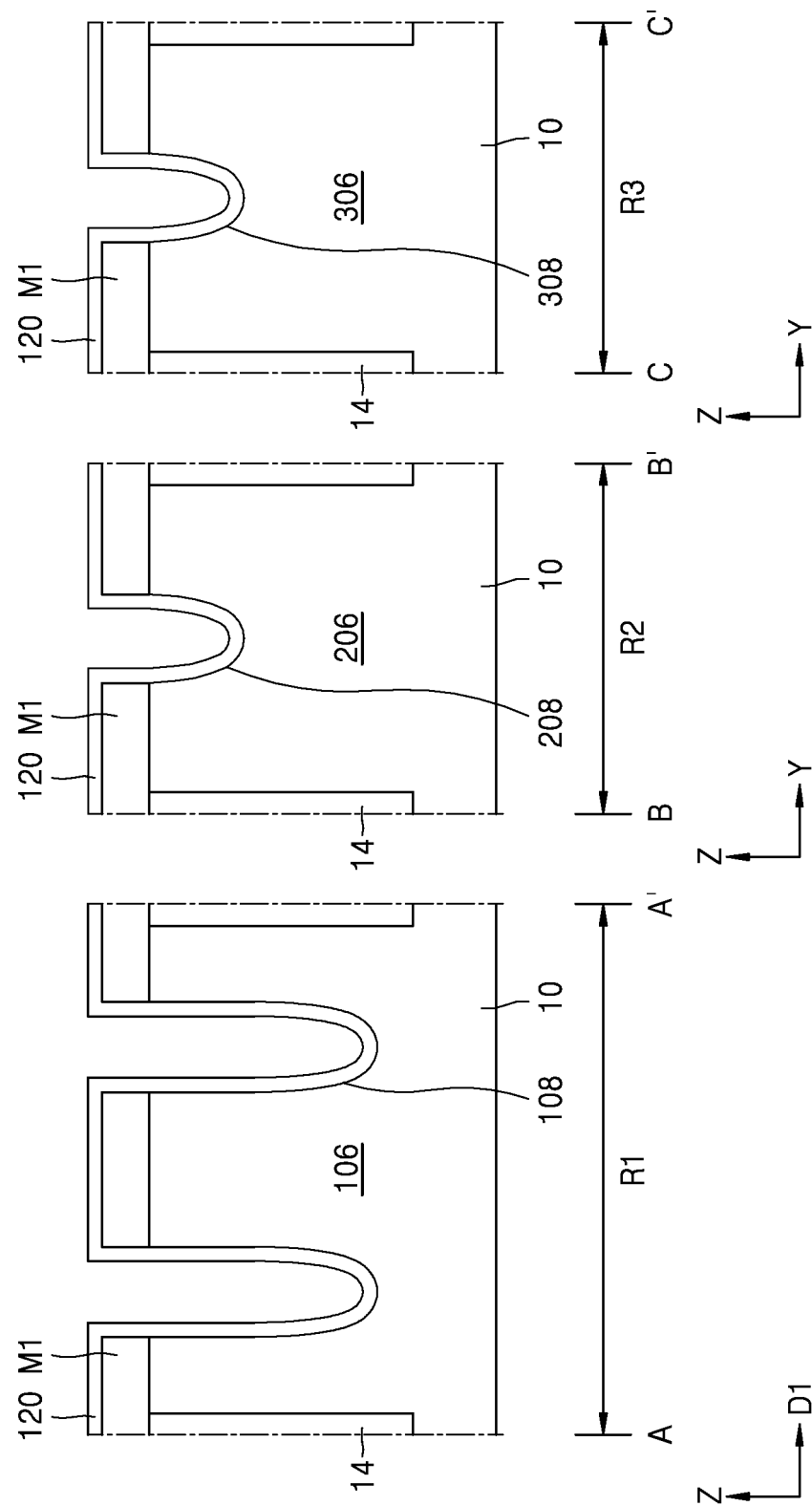

Referring to FIG. 4, the first gate insulating layer 120 may be formed on each of the first recess 108, the second recess 208, and the third recess 308. The first gate insulating layer 120 may be formed by an atomic layer deposition (ALD) method, thermal oxidation, or a combination thereof. The first gate insulating layer 120 may extend across the first mask M1, and between the first recesses 108, the second recesses 208, and the third recesses 308.

Figure 5:
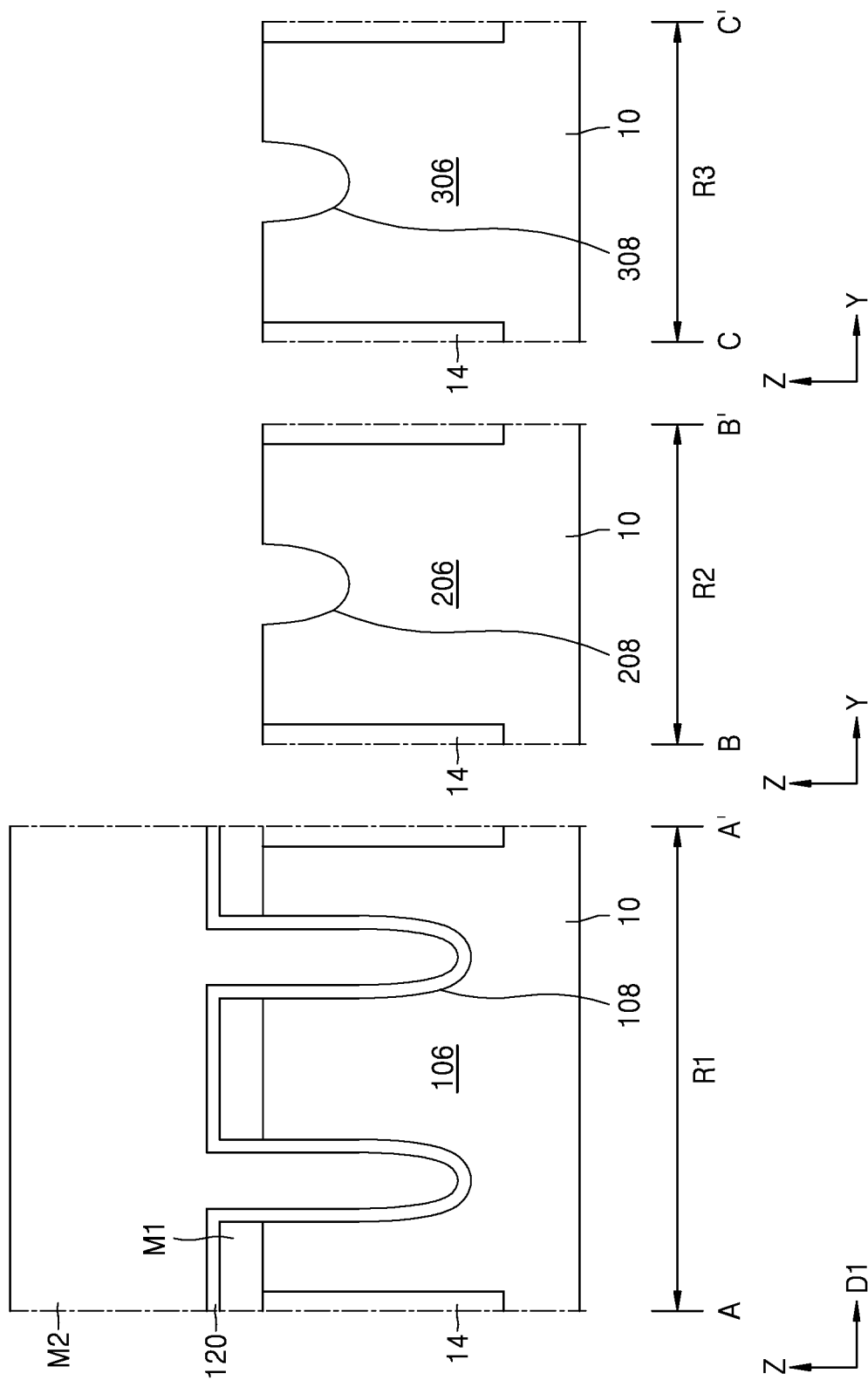

Referring to FIG. 5, a second mask M2 may be formed on the first gate insulating layer 120 in the first region R1 of the substrate 10. Next, the first gate insulating layer 120 in the second region R2 of the substrate 10 and the first gate insulating layer 120 in the third region R3 of the substrate 10 are removed. By doing so, the first gate insulating layer 120 remains only in the first region R1 of the substrate 10. When the first gate insulating layer 120 is etched, the first mask M1 on the second region R2 of the substrate 10 and the first mask M1 in the third region R3 of the substrate 10 may also be removed.

Figure 6:
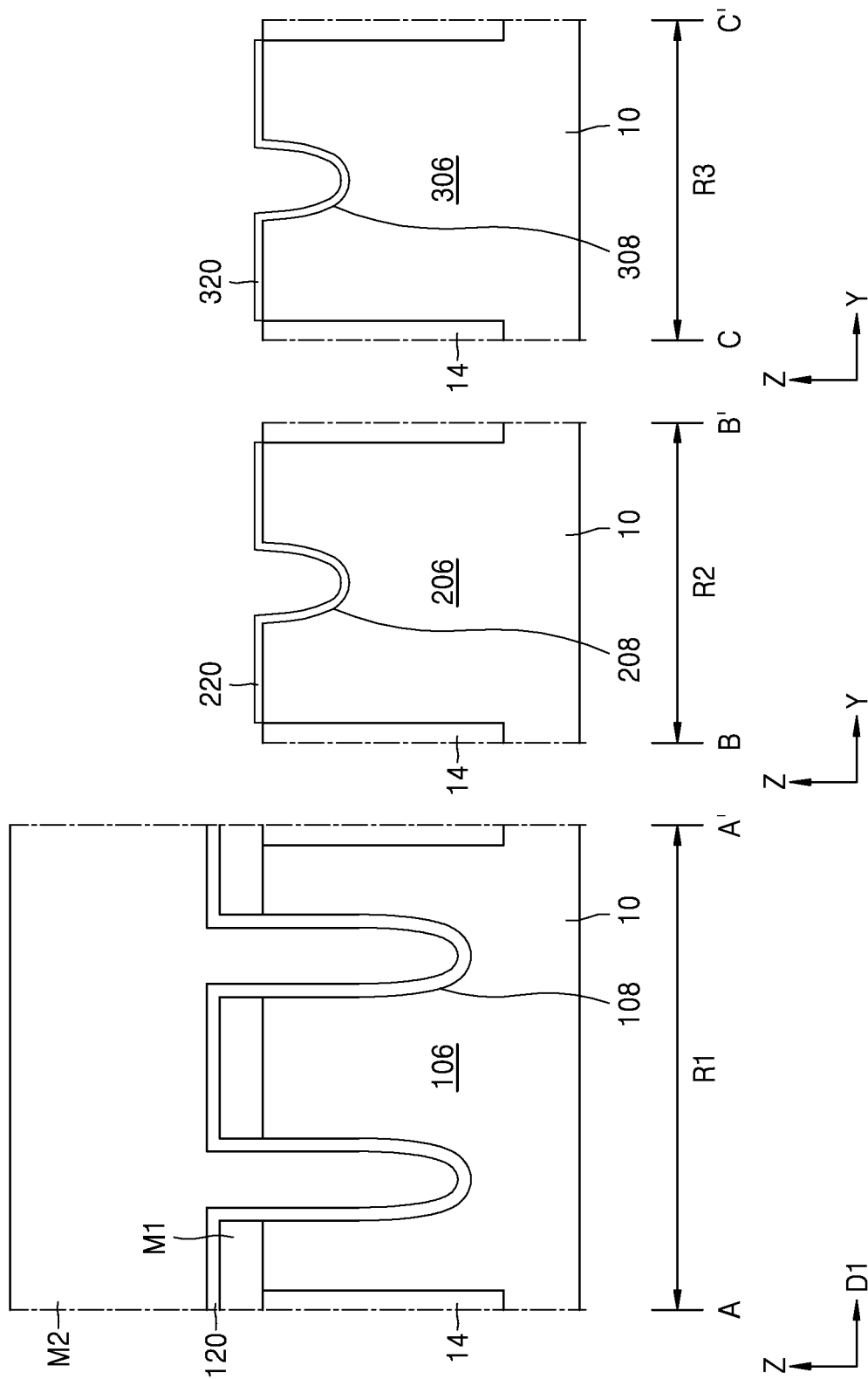

Referring to FIG. 6, the second gate insulating layer 220 may be formed on the second recess 208 in the second region R2 of the substrate 10, and the third gate insulating layer 320 may be formed on the third recess 308 in the third region R3 of the substrate 10. The second gate insulating layer 220 and the third gate insulating layer 320 may be formed simultaneously. For example, the second gate insulating layer 220 and the third gate insulating layer 320 may be formed at the same time using the same process and the same materials. The second gate insulating layer 220 and the third gate insulating layer 320 may be formed by thermal oxidation, but the embodiments are not limited thereto. Next, the second mask M2 may be removed.

Figure 7:
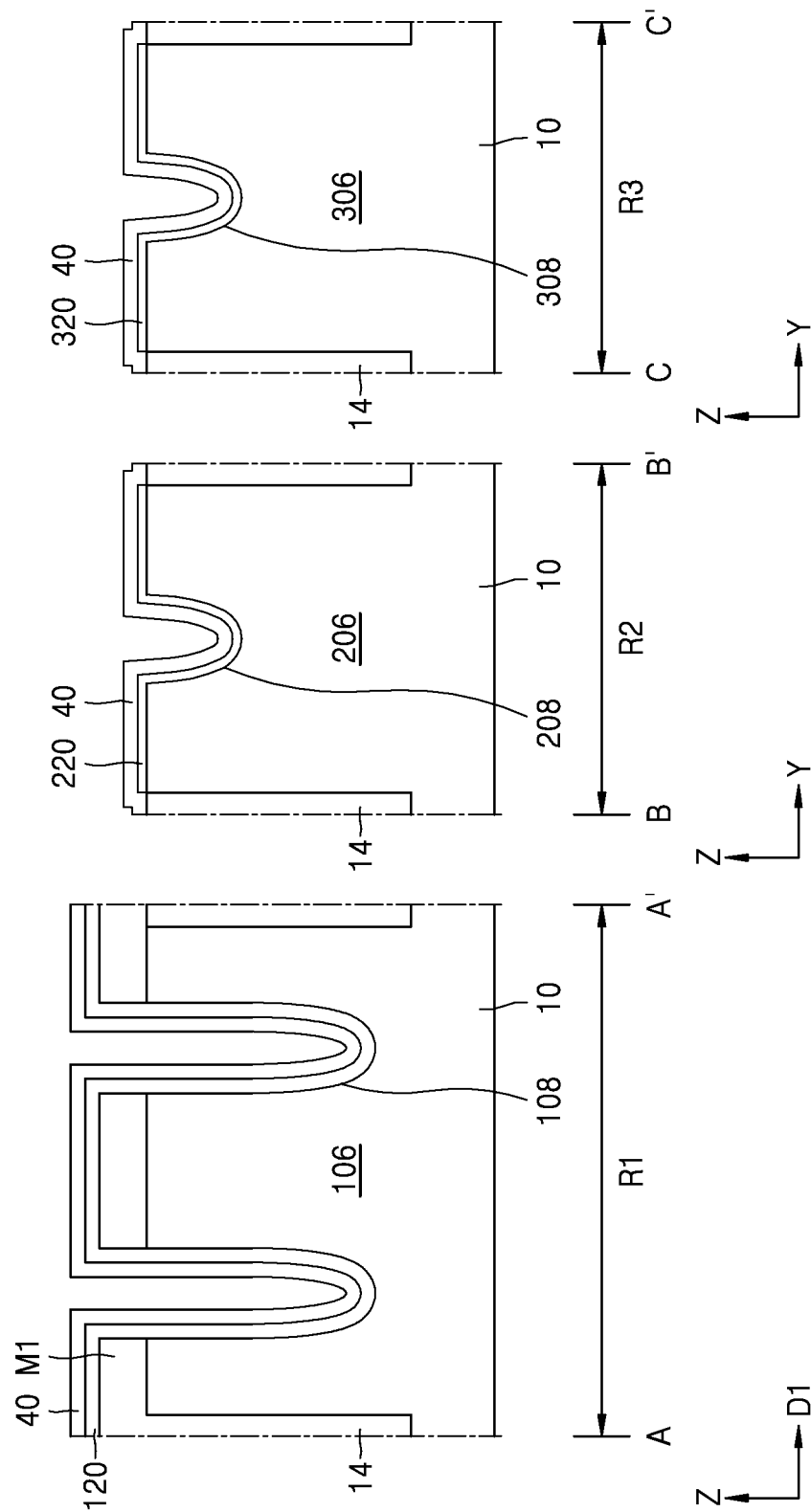

Referring to FIG. 7, a preliminary barrier layer 40 is formed on the first gate insulating layer 120, the second gate insulating layer 220, and the third gate insulating layer 320. The preliminary barrier layer 40 may include, but is not limited to, a metal nitride like TiN. The preliminary barrier layer 40 may be formed by various deposition methods such as an ALD method and/or a chemical vapor deposition (CVD) method.

Figure 8:
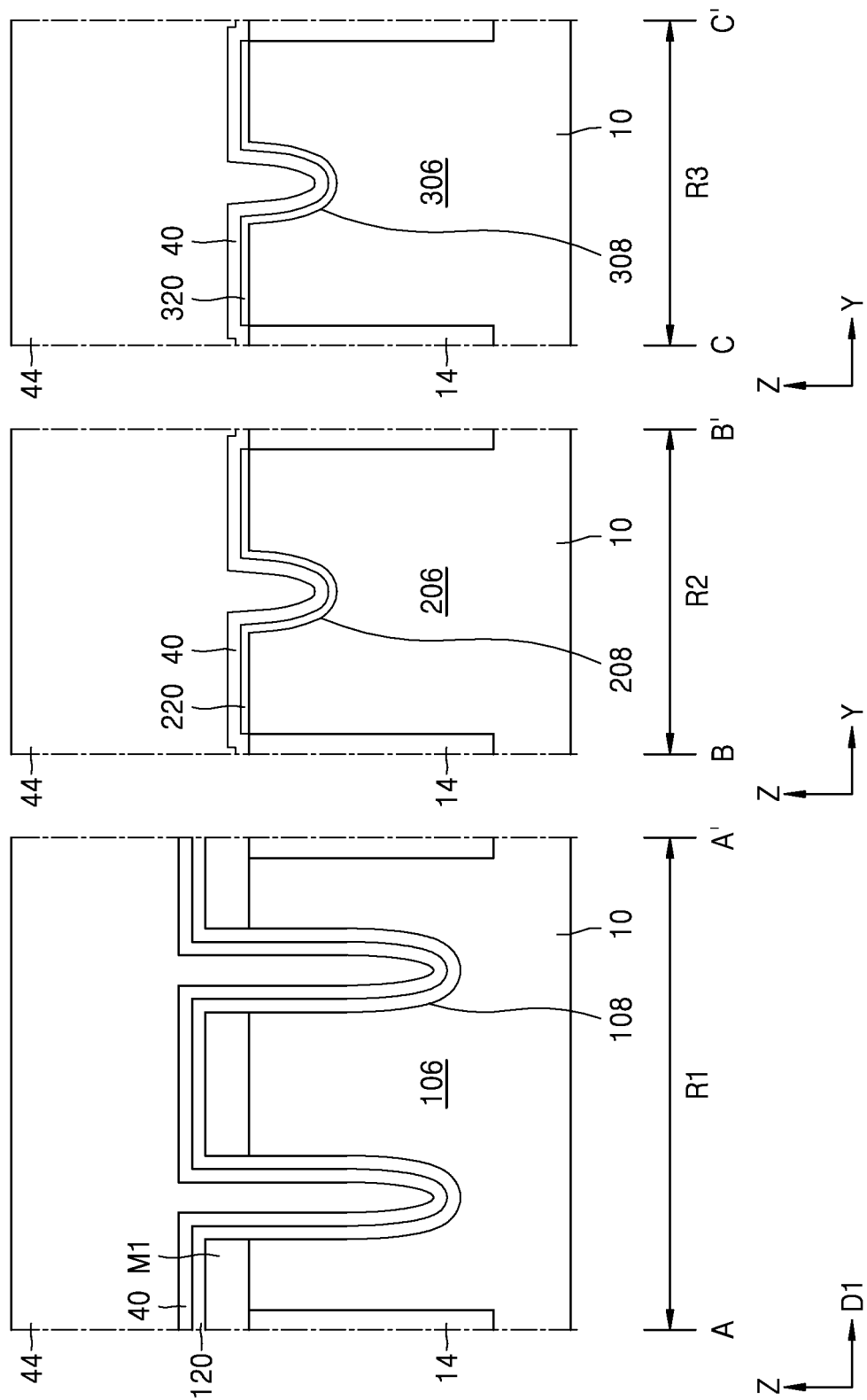

Referring to FIG. 8, a preliminary lower filling layer 44 may be formed on the preliminary barrier layer 40. The preliminary lower filling layer 44 may fill the first recess 108, the second recess 208, and the third recess 308. The preliminary lower filling layer 44 may include, but is not limited to, a metal such as, for example, tungsten. The preliminary lower filling layer 44 may be formed by using various deposition methods such as a CVD method or a physical vapor deposition (PVD) method.

Figure 9:
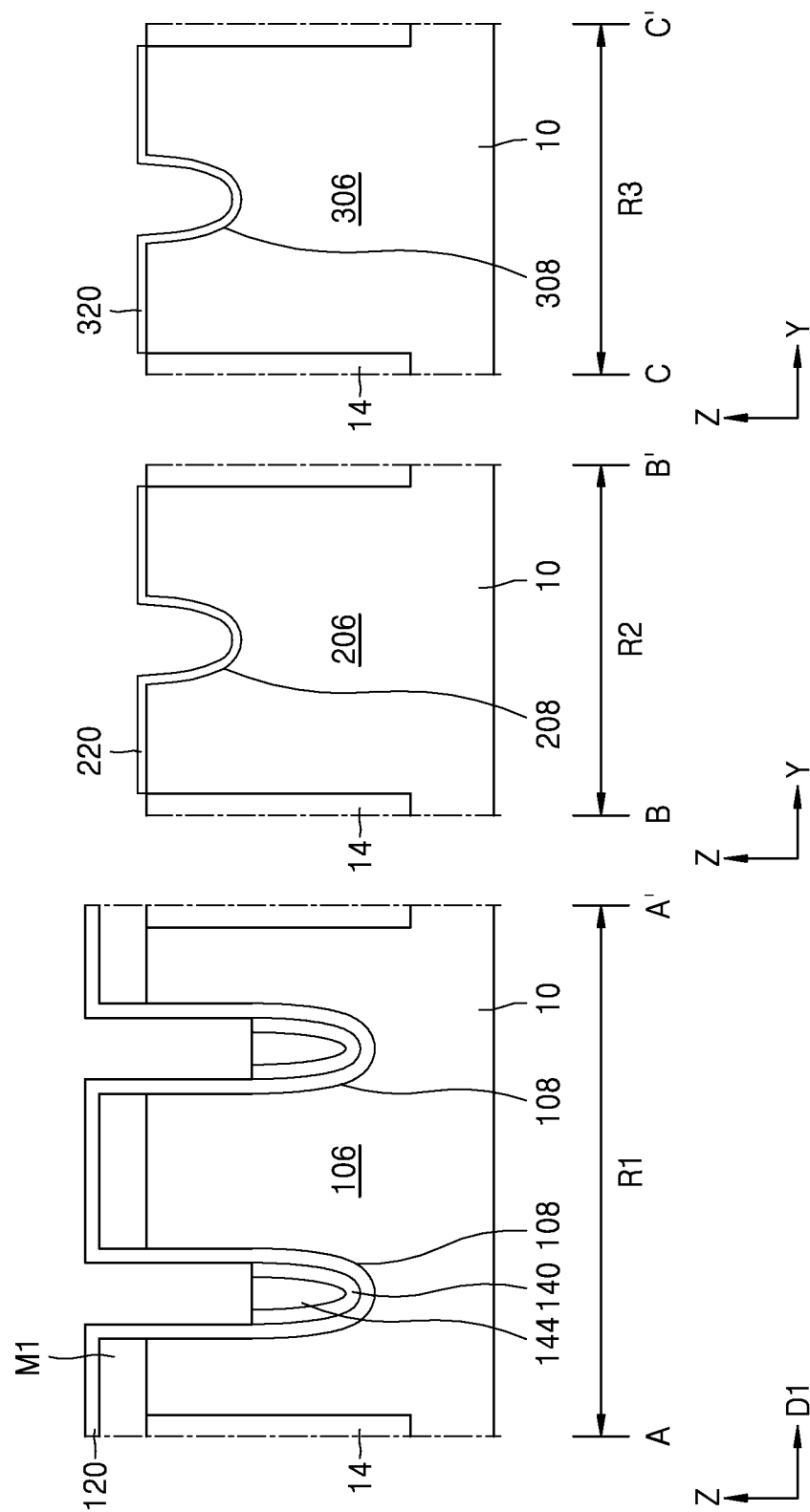

Referring to FIG. 9, the barrier layer 140 and the lower filling layer 144 may be formed by removing an upper portion of the preliminary barrier layer 40 (see FIG. 8) and an upper portion of the preliminary lower filling layer 44 (see FIG. 8). For example, a remaining portion of the preliminary barrier layer 40 except for the barrier layer 140 in the first recess 108 and a remaining portion of the preliminary lower filling layer 44 (see FIG. 8) except for the lower filling layer 144 may be removed. By doing so, a portion of the first gate insulating layer 120, the second gate insulating layer 220, and the third gate insulating layer 320 may not be covered by the barrier layer 140 and the lower filling layer 144. An etch back process may be used for the above-described removal operation.

Figure 10:
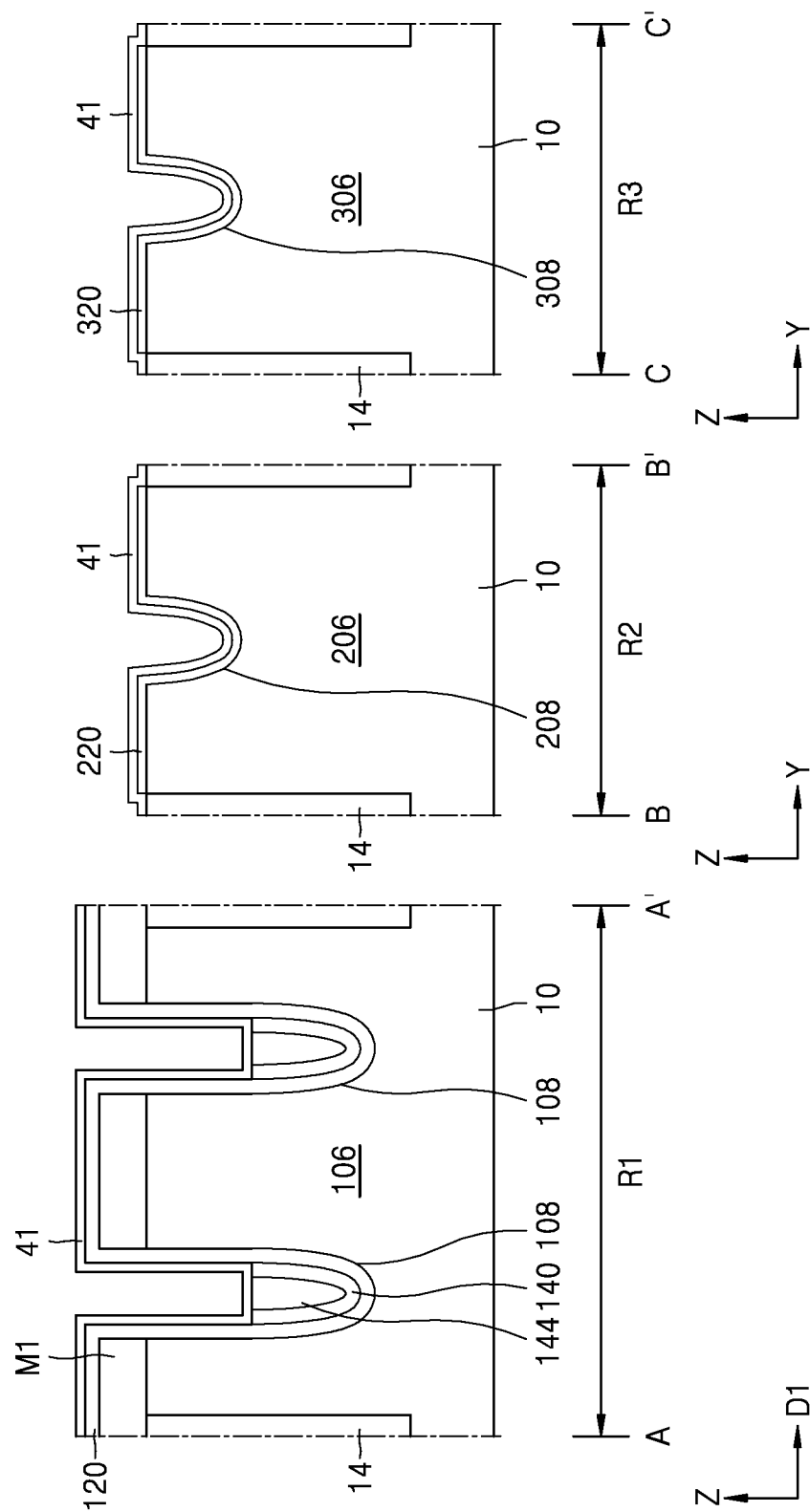

Referring to FIG. 10, a first preliminary work function adjustment layer 41 is formed on a portion of the first gate insulating layer 120 that is not covered by the barrier layer 140 and the lower filling layer 144, at the top of the barrier layer 140, on the lower filling layer 144, on the second gate insulating layer 220, and on the third gate insulating layer 320. The first preliminary work function adjustment layer 41 may include an alloy of metal-metal nitride.

An operation of forming the first preliminary work function adjustment layer 41 may include a plurality of operations. In some embodiments, a metal nitride layer (not shown) may be formed on the portion of the first gate insulating layer 120 that is not covered by the barrier layer 140 and the lower filling layer 144, the top of the barrier layer 140, the top of the lower filling layer 144, the second gate insulating layer 220, and the third gate insulating layer 320, and a metal oxide layer (not shown) may be formed on the metal nitride layer. Next, the first preliminary work function adjustment layer 41 may be formed by diffusing metal atoms in a metal oxide layer to a metal nitride layer. Next, the rest of the metal oxide layer may be removed. In some other embodiments, a metal oxide layer (not shown) may be formed on the portion of the first gate insulating layer 120 that is not covered by the barrier layer 140 and the lower filling layer 144, the top of the barrier layer 140, the top of the lower filling layer 144, the second gate insulating layer 220, and the third gate insulating layer 320, and a metal nitride (not shown) may be formed on the metal oxide layer. The first preliminary work function adjustment layer 41 may be formed by diffusing the metal atoms in the metal oxide layer to the metal nitride layer.

Figure 11:
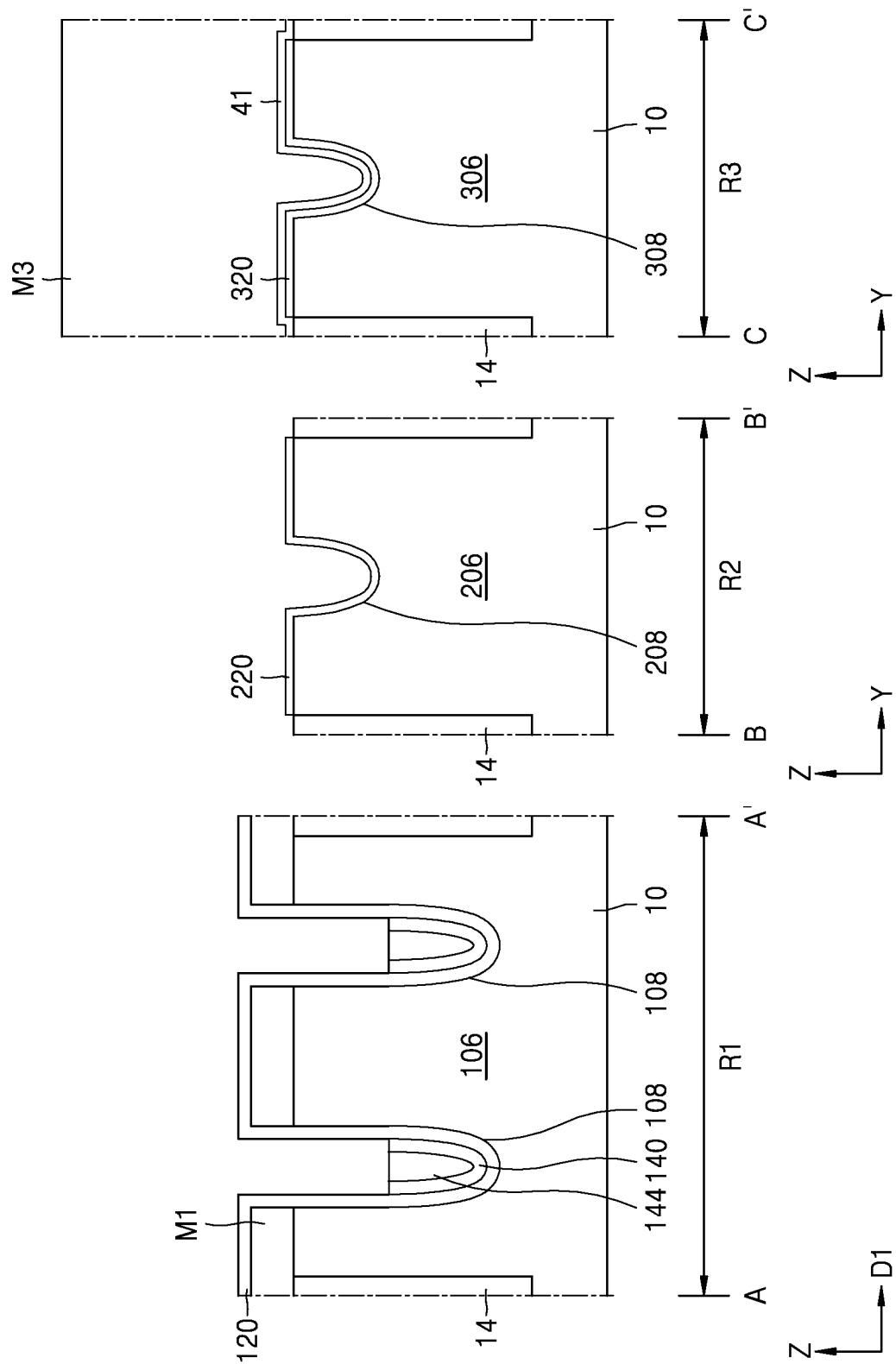

Referring to FIG. 11, a third mask M3 may be formed on the first preliminary work function adjustment layer 41 on the third gate insulating layer 320. Next, the first preliminary work function adjustment layer 41 (see FIG. 10) on the first gate insulating layer 120 and the first preliminary work function adjustment layer 41 (see FIG. 10) on the second gate insulating layer 220 may be removed. Due to the third mask M3, the first preliminary work function adjustment layer 41 on the third gate insulating layer 320 may remain. For example, a wet-etching method may be used for removing the first preliminary work function adjustment layers 41, but the present embodiment is not limited thereto. Next, the third mask M3 may be removed.

Figure 12:
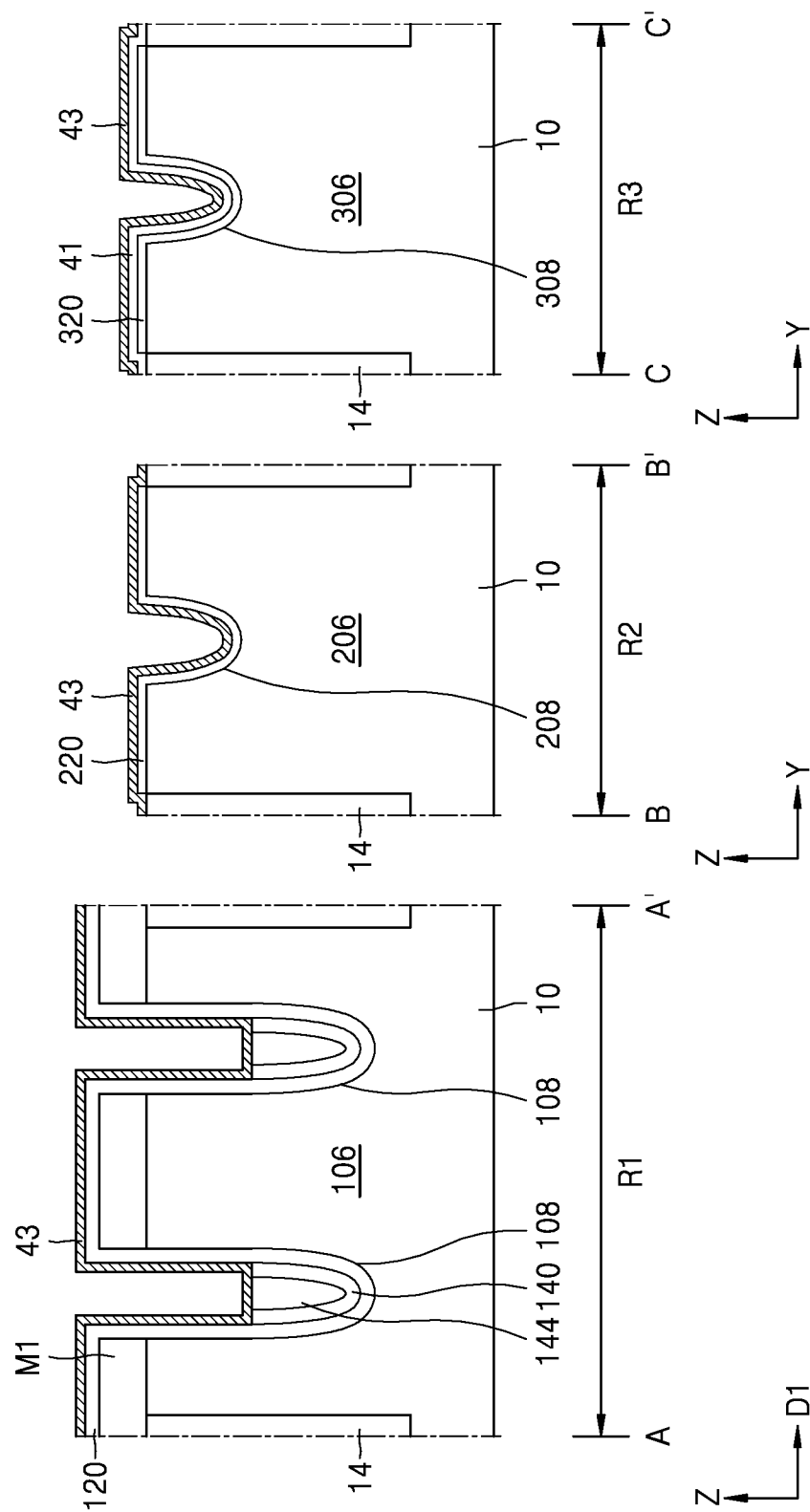

Referring to FIG. 12, a second preliminary work function adjustment layer 43 may be formed on the portion of the first gate insulating layer 120 that is not covered by the barrier layer 140 and the lower filling layer 144, the top of the barrier layer 140, the top of the lower filling layer 144, the second gate insulating layer 220, and the first preliminary work function adjustment layer 41. The second preliminary work function adjustment layer 43 may include an alloy of metal-metal nitride.

The forming of the second preliminary work function adjustment layer 43 may include a plurality of operations. In some embodiments, a metal nitride layer (not shown) may be formed on the portion of the first gate insulating layer 120 that is not covered by the barrier layer 140 and the lower filling layer 144, the top of the barrier layer 140, the top of the lower filling layer 144, the second gate insulating layer 220, and the first preliminary work function adjustment layer 41, and a metal oxide layer (not shown) may be formed on the metal nitride layer. Next, the second preliminary work function adjustment layer 43 may be formed by diffusing the metal atoms in the metal oxide layer to the metal nitride layer. Next, the rest of the metal oxide layer may be removed. In some other embodiments, a metal oxide layer (not shown) may be formed on the portion of the first gate insulating layer 120 that is not covered by the barrier layer 140 and the lower filling layer 144, the top of the barrier layer 140, the top of the lower filling layer 144, the second gate insulating layer 220, and the first preliminary work function adjustment layer 41, and a metal nitride layer (not shown) may be formed on the metal oxide layer. The second preliminary work function adjustment layer 43 may be formed by diffusing the metal atoms in the metal oxide layer to the metal nitride layer.

Figure 13:
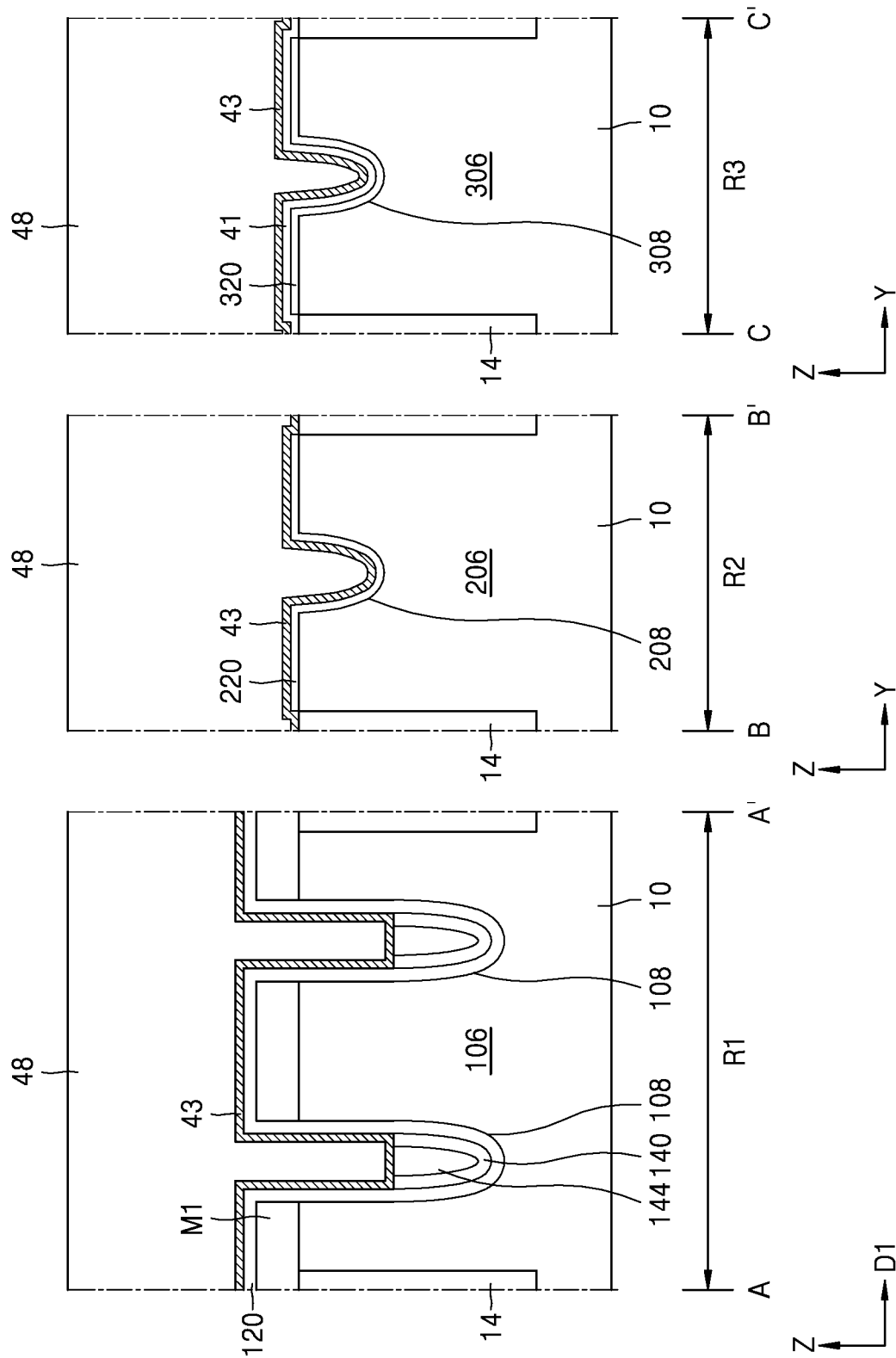

Referring to FIG. 13, a preliminary upper filling layer 48 may be formed on the second preliminary work function adjustment layer 43. The preliminary upper filling layer 48 may include, but is not limited to, a metal such as, for example, tungsten. The preliminary upper filling layer 48 may be formed by various deposition methods including a CVD method, a PVD method, and the like.

Figure 14:
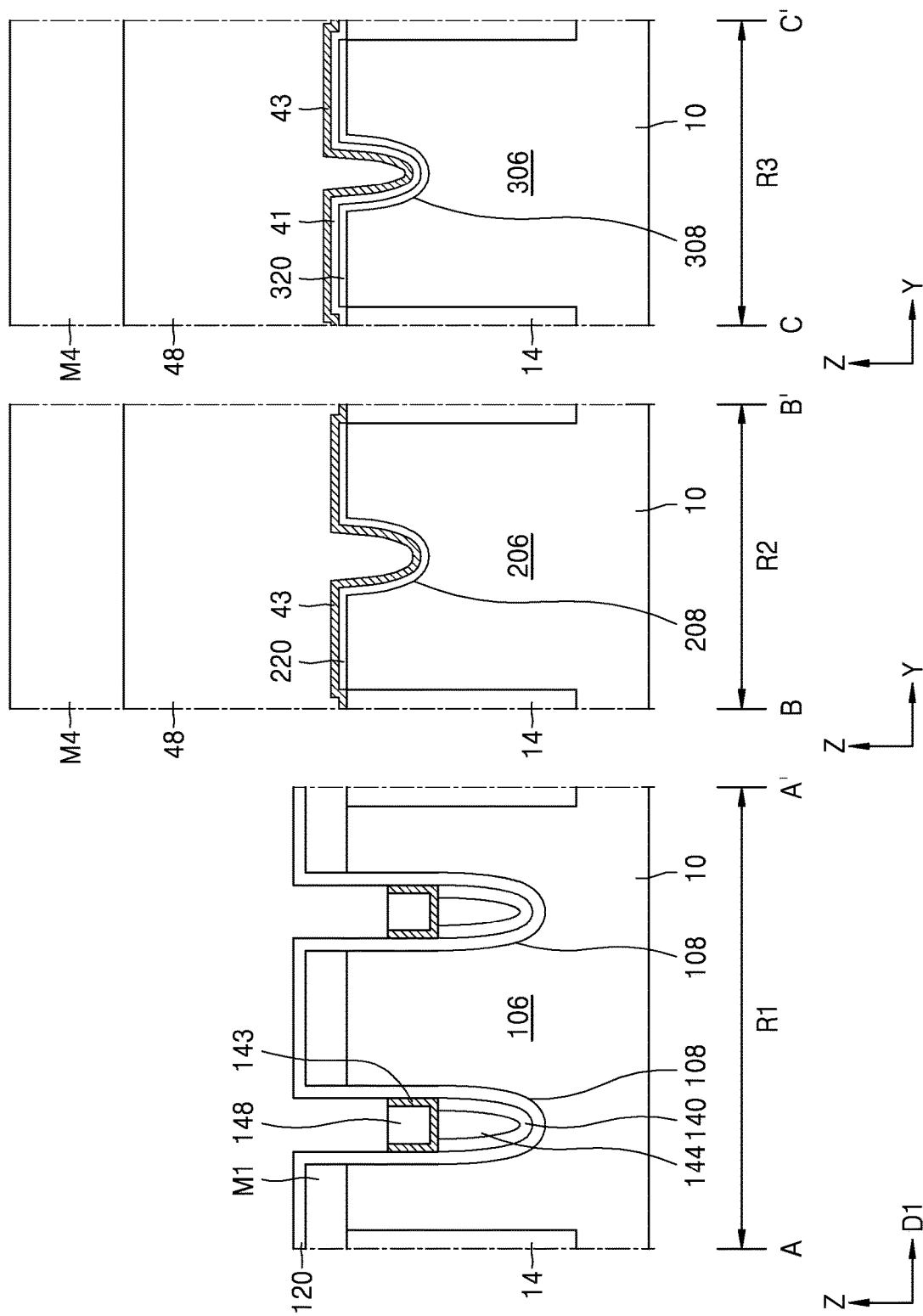

Referring to FIG. 14, a fourth mask M4 may be formed on the preliminary upper filling layer 48 on the second preliminary work function adjustment layer 43 on the second gate insulating layer 220 and on the preliminary upper filling layer 48 on the second preliminary work function adjustment layer 43 on the first preliminary work function adjustment layer 41 on the third gate insulating layer 320. For example, the fourth mask M4 may not cover the preliminary upper filling layer 48 on the second preliminary work function adjustment layer 43 on the first gate insulating layer 120. Next, the upper filling layer 148 and the first work function adjustment layer 143 may be formed in the first recess 108 by removing an upper portion of the preliminary upper filling layer 48 and an upper portion of the second preliminary work function adjustment layer 43. An etch back process may be used for the above-mentioned removal process. Next, the fourth mask M4 may be removed.

Figure 15:
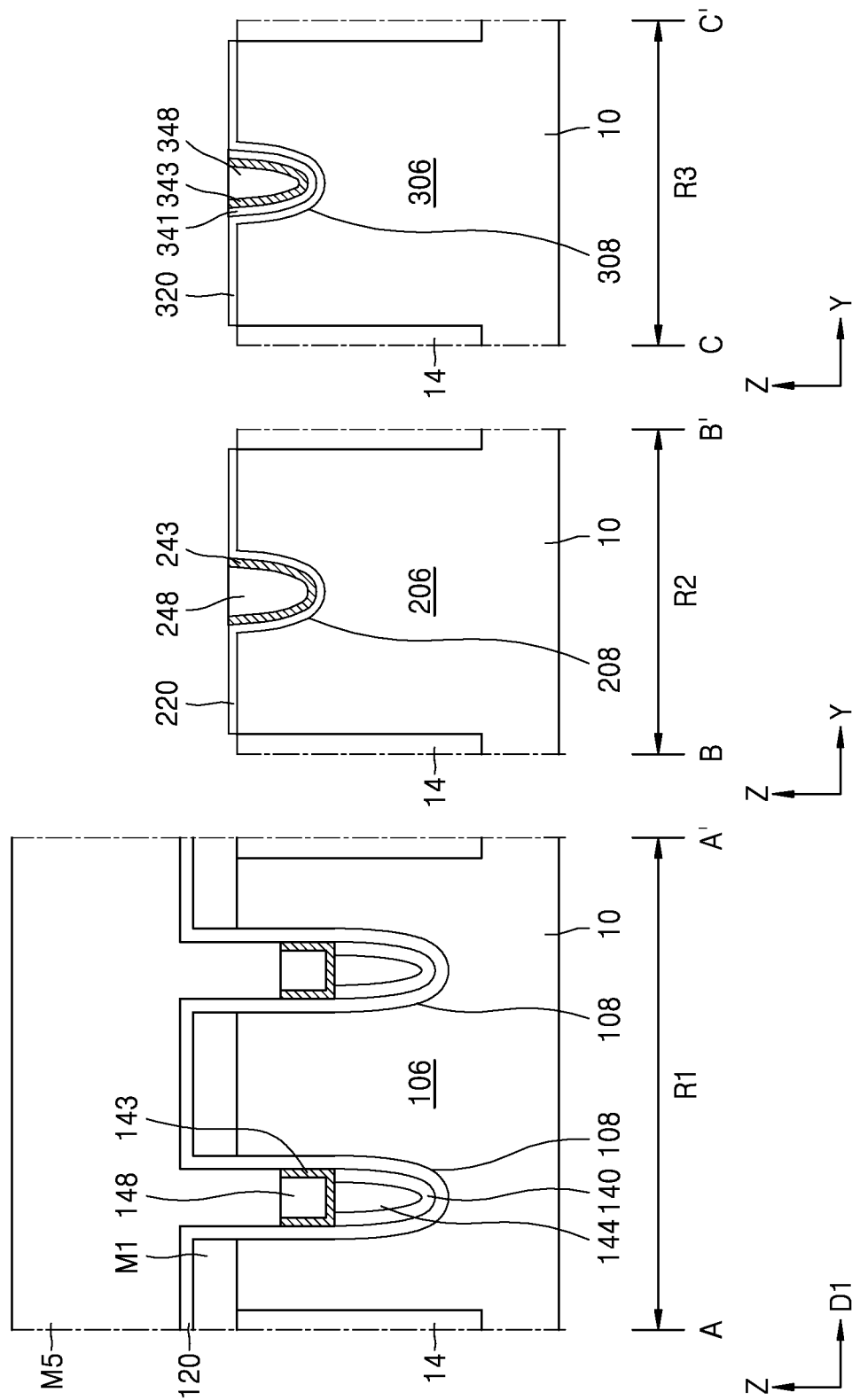

Referring to FIG. 15, a fifth mask M5 may be formed on the first gate insulating layer 120, on top of the first work function adjustment layer 143, and on top of the upper filling layer 148. Next, the second work function adjustment layer 243 and the first filling layer 248 may be formed by removing the upper portion of the second preliminary work function adjustment layer 43 (see FIG. 14) and the preliminary upper filling layer 48 (see FIG. 14) on the second gate insulating layer 220. An etch back process may be used for the above-mentioned removal process. At the same time, the third work function adjustment layer 341, the fourth work function adjustment layer 343, and the second filling layer 348 may be formed by removing the upper portion of the first preliminary work function adjustment layer 41 (see FIG. 14), the upper portion of the second preliminary work function adjustment layer 43, and the upper portion of the preliminary upper filling layer 48 (see FIG. 14) on the third gate insulating layer 320. An etch back process may be used for the above-mentioned removal process.

Figure 16:
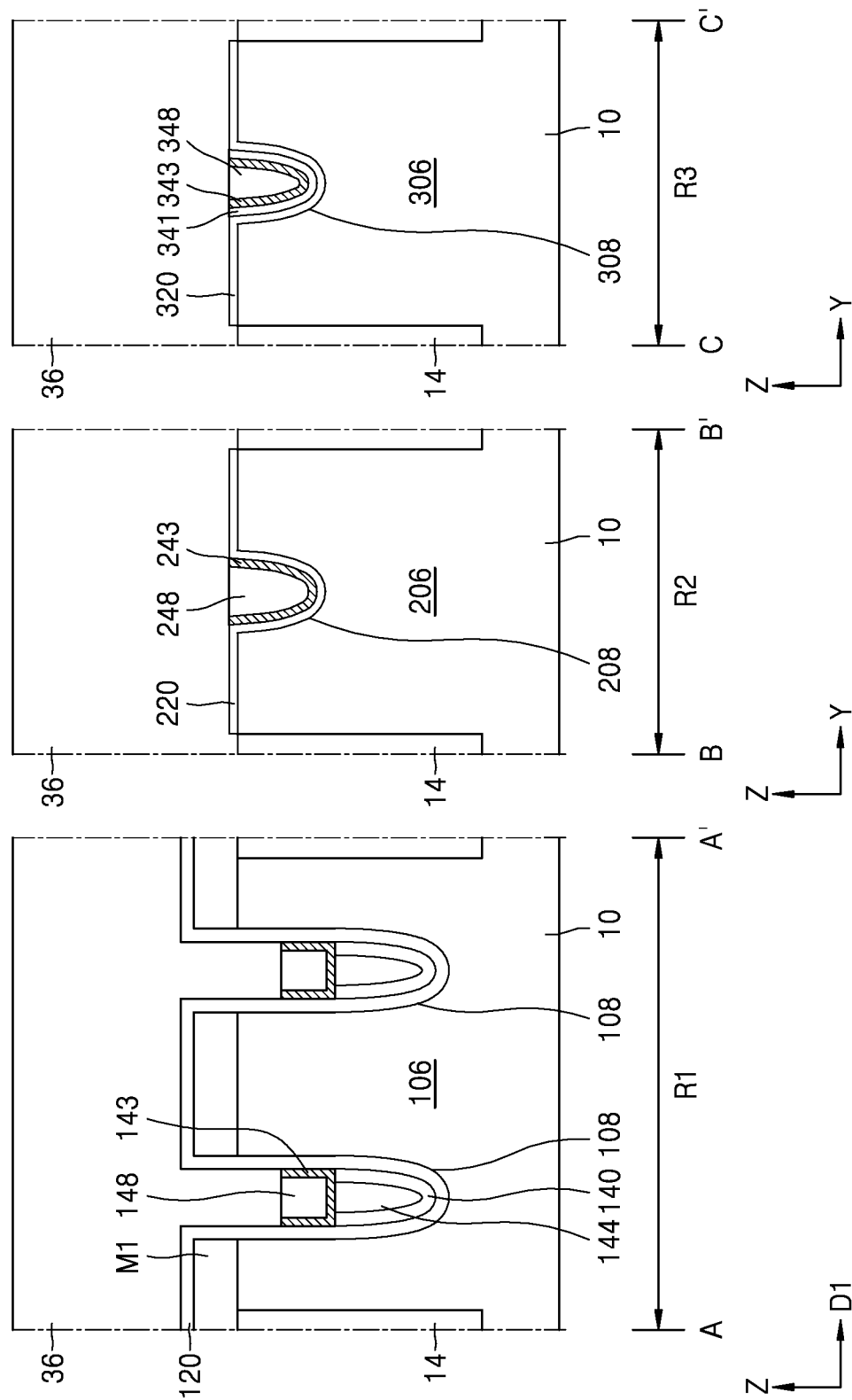

Referring to FIG. 16, a first preliminary capping layer 36 may be formed on the upper filling layer 148, the first filling layer 248, and the second filling layer 348. The first preliminary capping layer 36 may contact the first work function adjustment layer 143, the first gate insulating layer 120, the second gate insulating layer 220, and the third gate insulating layer 320. The first preliminary capping layer 36 may be formed in various deposition methods including CVD, PVD, and the like. The first preliminary capping layer 36 may include, but is not limited to, silicon nitride.

Figure 17:
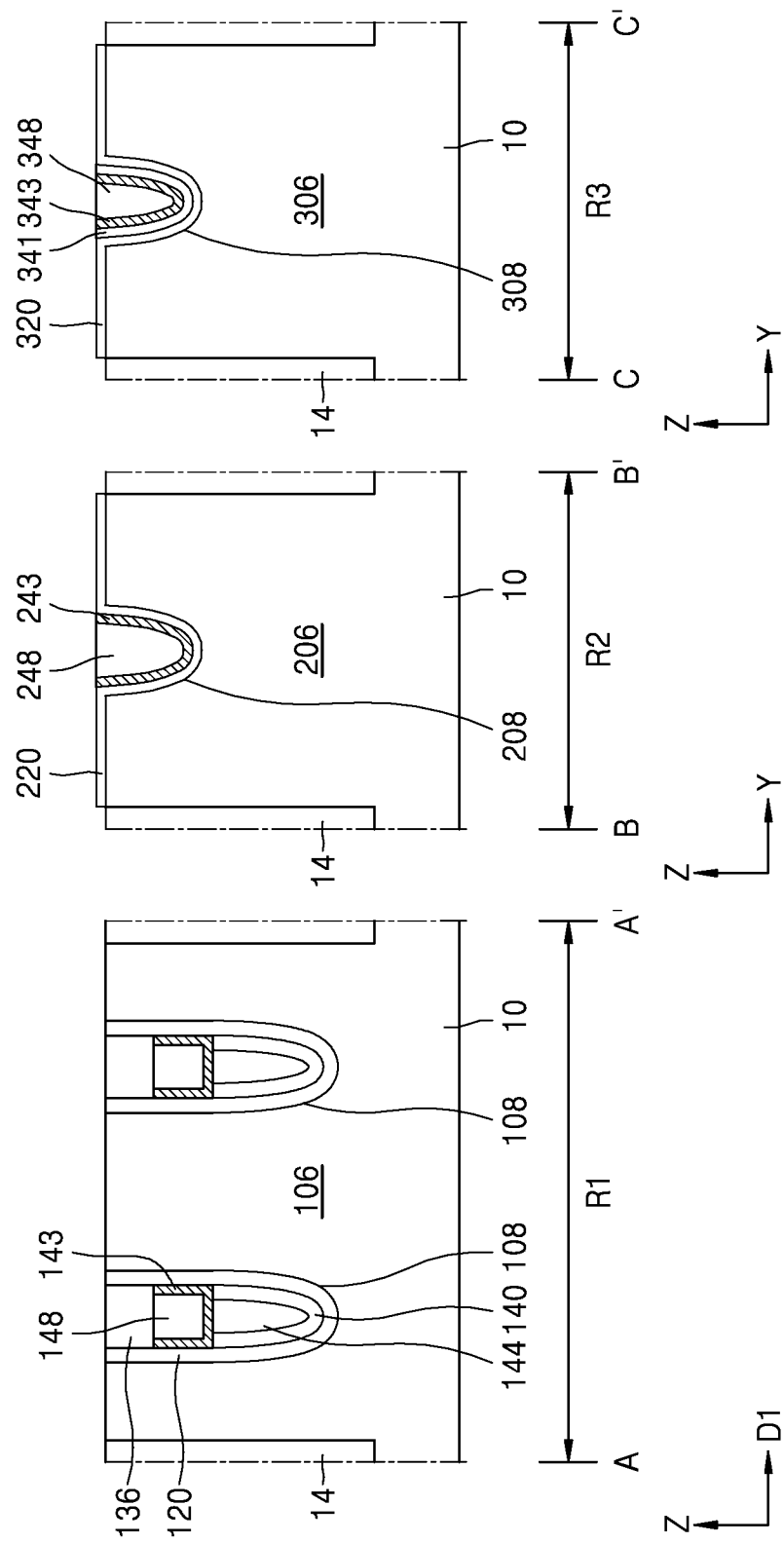

Referring to FIG. 17, the first gate capping layer 136 may be formed in the first recess 108 as an upper portion of the first preliminary capping layer 36 (see FIG. 16) is removed. From the first preliminary capping layer 36 (see FIG. 16), a portion except a portion in the first recess 108 may be removed. For example, a top surface of the first gate capping layer 136, which is formed in first recess 108 from the first preliminary capping layer 36, may be coplanar with a top surface of the substrate 10. An etch back process may be used for the above-mentioned removal process. The first mask M1 on the first region R1 of the substrate 10 may also be removed.

Figure 18:
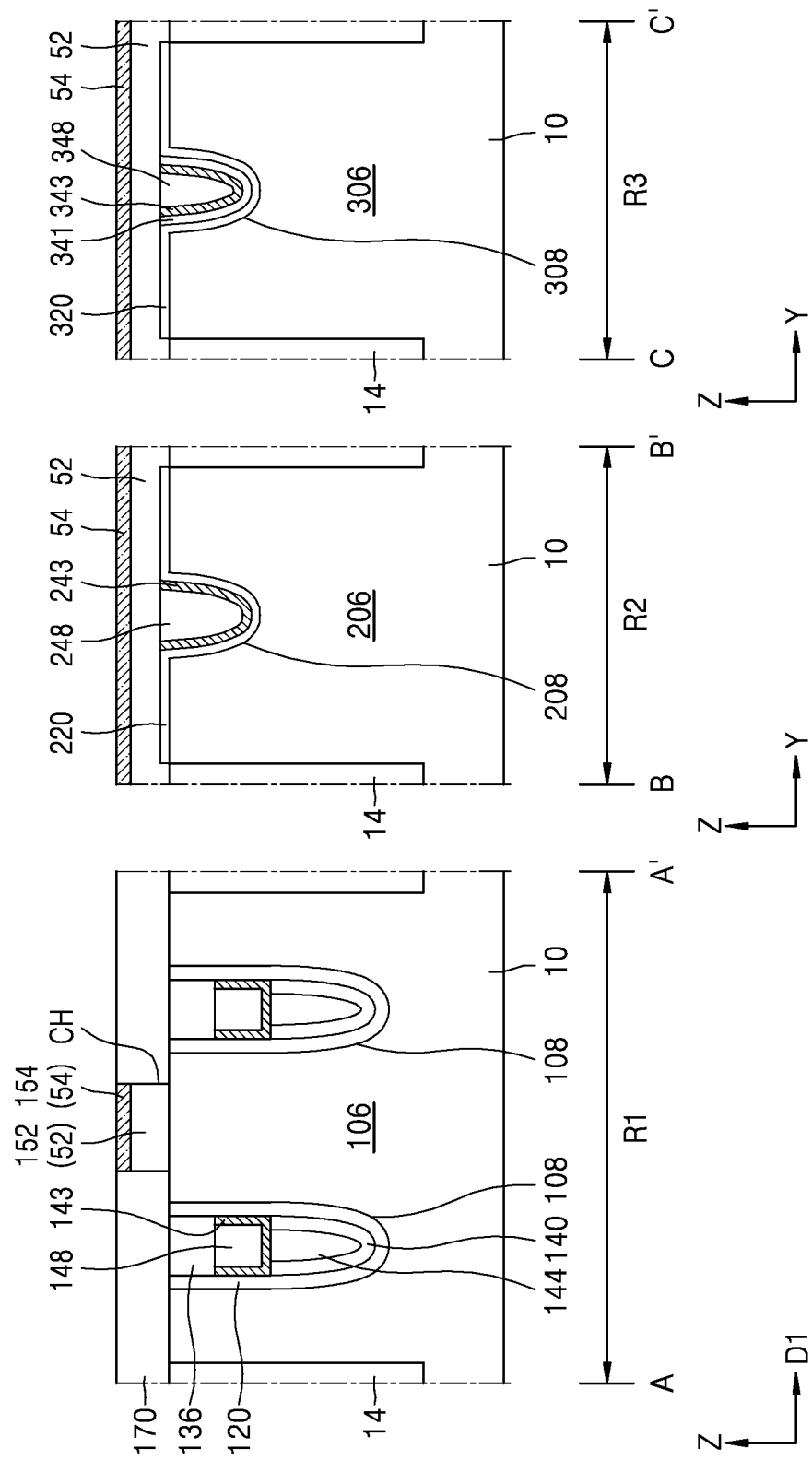

Referring to FIG. 18, the interlayer insulating layer 170 may be formed in the first region R1 of the substrate 10. The interlayer insulating layer 170 may be formed in various deposition methods including CVD, PVD, and the like. A contact hole CH may be formed in the interlayer insulating layer 170. A first material layer 52 may be formed in the contact hole CH, on the first filling layer 248, and on the second filling layer 348. The first material layer 52 may include, but is not limited to, polysilicon. Next, a second material layer 54 may be formed on the first material layer 52. The second material layer 54 may include, but is not limited to, TSN. The bit line contact 152 and the interface layer 154 may be formed in the contact hole CH by partially removing the first material layer 52 and the second material layer 54. An etch back process or a chemical mechanical polish (CMP) process may be used for the above-mentioned removal process.

Figure 19:
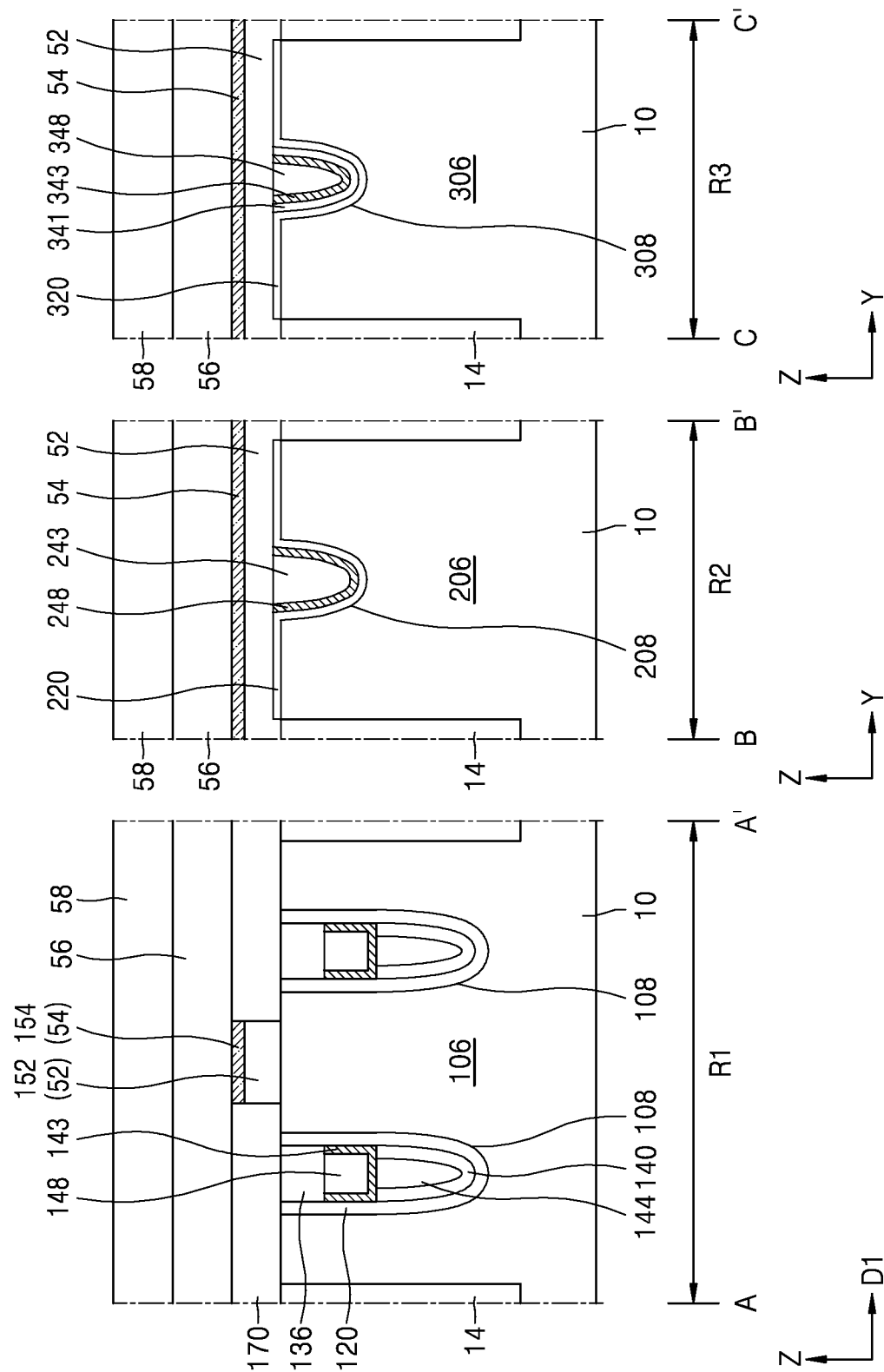

Referring to FIG. 19, a third material layer 56 may be formed on the interface layer 154 and the second material layer 54. The third material layer 56 may include, but is not limited to, a metal like tungsten. A second preliminary capping layer 58 may be formed on the third material layer 56. The second preliminary capping layer 58 may include, but is not limited to, silicon nitride. The third material layer 56 and the second preliminary capping layer 58 may be formed in various deposition methods including a CVD method, a PVD method, and the like.

Referring to FIGS. 19 and 2, the bit line 156, the bit line capping layer 158, the first gate layer 252, the second gate layer 254, the third gate layer 256, the second gate capping layer 258, the fourth gate layer 352, the fifth gate layer 354, the sixth gate layer 356, and the third gate capping layer 358 may be formed by patterning the first material layer 52, the second material layer 54, the third material layer 56, and the second preliminary capping layer 58. By doing so, a semiconductor device according to an example embodiment of the inventive concept may be manufactured. According to the above-mentioned manufacturing method, the first recess gate structure 200 and the second recess gate structure 300, which are simultaneously manufactured with the buried gate structure 100, do not need additional manufacturing processes and may be easily manufactured.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate comprising a first region and a second region;
   a buried gate structure located on a first recess in the first region of the substrate and comprising a first work function adjustment layer; and
   a recess gate structure located on a second recess in the second region of the substrate and comprising a second work function adjustment layer,
   wherein the buried gate structure is buried in the substrate,
   wherein an upper portion of the recess gate structure is not buried in the substrate,
   wherein the first work function adjustment layer in the buried gate structure and the second work function adjustment layer in the recess gate structure comprise the same material, and
   wherein a depth of the first recess is greater than a depth of the second recess.

2. The semiconductor device of claim 1,
   wherein each of the first work function adjustment layer in the buried gate structure and the second work function adjustment layer in the recess gate structure comprises a metal-metal nitride alloy.

3. The semiconductor device of claim 2,
   wherein each of the first work function adjustment layer in the buried gate structure and the second work function adjustment layer in the recess gate structure comprises lanthanum-titanium nitride alloy.

4. The semiconductor device of claim 1, further comprising:
   a bit line contact, an interface layer, a bit line, and a bit line capping layer sequentially stacked in the first region of the substrate,
   wherein the upper portion of the recess gate structure comprises a first gate layer, a second gate layer, a third gate layer, and a gate capping layer which are sequentially stacked, and
   wherein each of the bit line contact, the interface layer, the bit line, and the bit line capping layer comprises a material the same as a material included in each of the first gate layer, the second gate layer, the third gate layer, and the gate capping layer, respectively.

5. The semiconductor device of claim 1,
wherein the buried gate structure further comprises a lower filling layer at a lower portion of the buried gate structure, and a barrier layer between the first recess and the lower filling layer.

6. The semiconductor device of claim 1,
wherein the buried gate structure further comprises an upper filling layer at an upper portion of the buried gate structure, and
wherein the first work function adjustment layer is located between the first recess and the upper filling layer.

7. The semiconductor device of claim 1,
wherein the buried gate structure is a portion of a first N-type transistor, and
the recess gate structure is a portion of a second N-type transistor.

8. A semiconductor device comprising:
a substrate comprising a first region and a second region;
a buried gate structure on a first recess in the first region of the substrate; and
a recess gate structure on a second recess in the second region of the substrate,
wherein the buried gate structure comprises a first gate insulating layer on the first recess, a lower filling layer at a lower portion of the buried gate structure, an upper filling layer at an upper portion of the buried gate structure, and a first work function adjustment layer between the upper filling layer and the first gate insulating layer,
wherein the recess gate structure comprises a second gate insulating layer on the second recess, a second work function adjustment layer on the second gate insulating layer, and a filling layer on the second work function adjustment layer,
wherein the first work function adjustment layer comprises a material the same as a material included in the second work function adjustment layer,
wherein the first work function adjustment layer comprises a portion between the lower filling layer and the upper filling layer,
wherein the recess gate structure further comprises a first gate layer, a second gate layer, a third gate layer, and a gate capping layer sequentially stacked on the filling layer, and
wherein the first gate layer, the second gate layer, the third gate layer, and the gate capping layer are not buried in the substrate.

9. The semiconductor device of claim 8,
wherein the buried gate structure further comprises a barrier layer between the lower filling layer and the first gate insulating layer.

10. The semiconductor device of claim 8,
wherein a portion of each of the second gate insulating layer, the second work function adjustment layer, and the filling layer is buried in the substrate.

11. The semiconductor device of claim 8, further comprising:
a bit line contact, an interface layer, a bit line, and a bit line capping layer sequentially stacked on the first region of the substrate,
wherein each of the bit line contact, the interface layer, the bit line, and the bit line capping layer comprises a material the same as a material included in each of the first gate layer, the second gate layer, the third gate layer, and the gate capping layer in the recess gate structure, respectively.

12. A semiconductor device comprising:
a substrate comprising a first region, a second region, and a third region;
a buried gate structure comprising a first gate insulating layer on a first recess in the first region of the substrate and a first work function adjustment layer on the first gate insulating layer;
a first recess gate structure comprising a second gate insulating layer on a second recess in the second region of the substrate and a second work function adjustment layer on the second gate insulating layer; and
a second recess gate structure comprising a third gate insulating layer on a third recess in the third region of the substrate and a third work function adjustment layer on the third gate insulating layer,
wherein the first work function adjustment layer and the second work function adjustment layer comprise a same material,
wherein the first work function adjustment layer and the third work function adjustment layer comprise different materials,
wherein the buried gate structure is a portion of a first N-type transistor,
wherein the first recess gate structure is a portion of a second N-type transistor, and
wherein the second recess gate structure is a portion of a P-type transistor.

13. The semiconductor device of claim 12,
wherein the third work function adjustment layer comprises a metal-metal nitride alloy.

14. The semiconductor device of claim 13,
wherein the third work function adjustment layer comprises aluminum-titanium nitride alloy.

15. The semiconductor device of claim 12,
wherein the second recess gate structure further comprises a fourth work function adjustment layer on the third work function adjustment layer.

16. The semiconductor device of claim 15,
wherein the fourth work function adjustment layer comprises a material the same as a material included in the first work function adjustment layer.

* * * * *